United States Patent [19]

Johnston et al.

[11] 4,077,061
[45] Feb. 28, 1978

[54] DIGITAL PROCESSING AND CALCULATING AC ELECTRIC ENERGY METERING SYSTEM

[75] Inventors: Paul M. Johnston, Hempfield Township, Allegheny County; Andras I. Szabo, Murrysville Borough, both of Pa.

[73] Assignee: Westinghouse Electric Corporation, Pittsburgh, Pa.

[21] Appl. No.: 781,261

[22] Filed: Mar. 25, 1977

[51] Int. Cl.² .................................... G01R 21/06
[52] U.S. Cl. .................... 364/483; 364/492; 324/76 R
[58] Field of Search .......... 235/151.31, 151.21; 324/76 R, 78 D, 83 D, 103 R, 115, 142, 99 D; 361/79, 86, 87; 364/200

[56] References Cited

U.S. PATENT DOCUMENTS

| | | |
|---|---|---|
| 3,569,785 | 3/1971 | Durbeck et al. .................. 317/27 |
| 3,758,763 | 9/1973 | Nohara et al. ............... 235/151.31 |
| 3,764,908 | 10/1973 | Elms ........................... 324/142 |
| 3,864,631 | 2/1975 | Zitelli et al. ................... 324/115 |
| 3,984,737 | 10/1976 | Okamura et al. ........ 235/151.31 X |

*Primary Examiner*—Edward J. Wise
*Attorney, Agent, or Firm*—R. W. Smith

[57] ABSTRACT

A metering system for electric utility power line measurements includes voltage and current signal inputs that are randomly sampled and converted to binary representations. A system sequence controller and calculator provides programmed control for processing digital control and data signals and for producing digital calculations of electric energy parameters from the binary representations of the instantaneous signal values. Memory registers totalize and accumulate digitally calculated values for producing visual displays and output signals that correspond to electric energy parameters to be measured.

30 Claims, 14 Drawing Figures

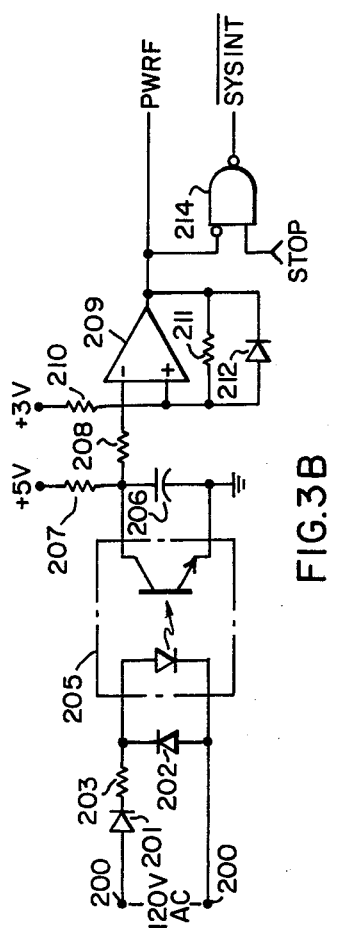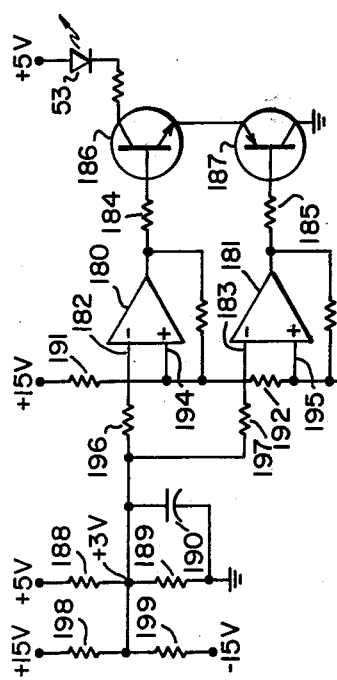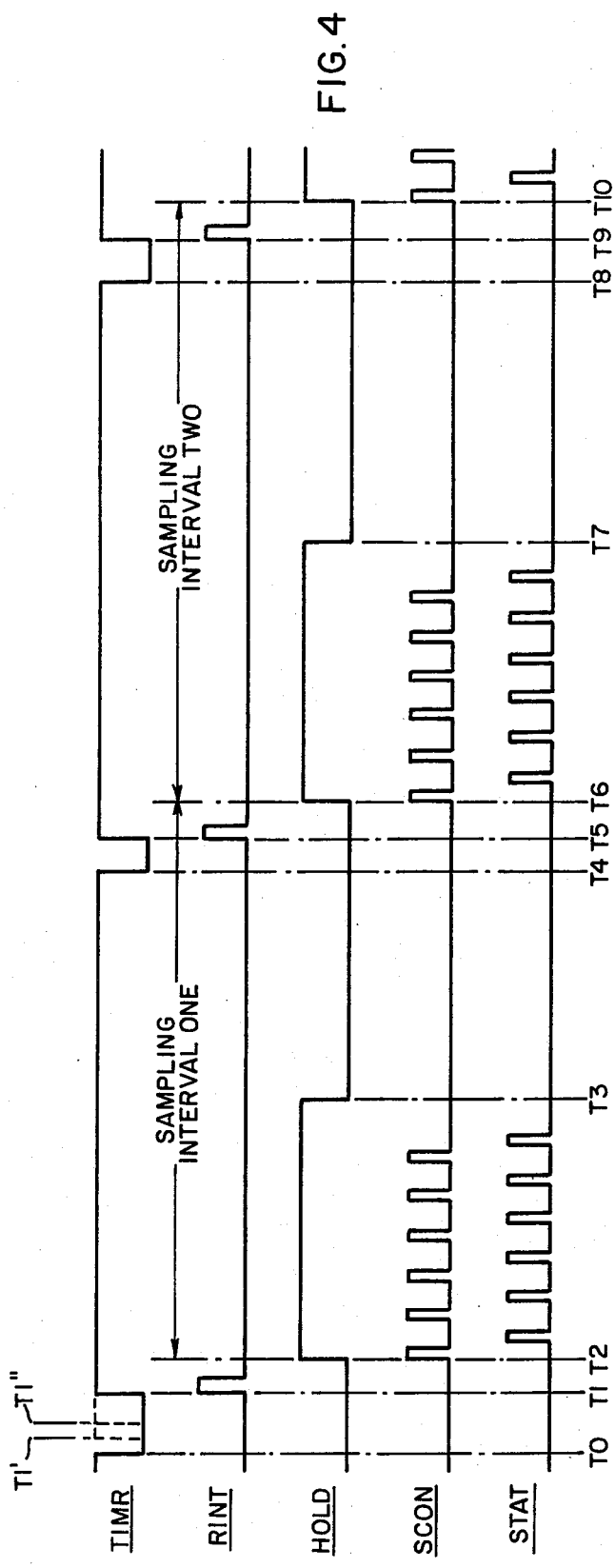

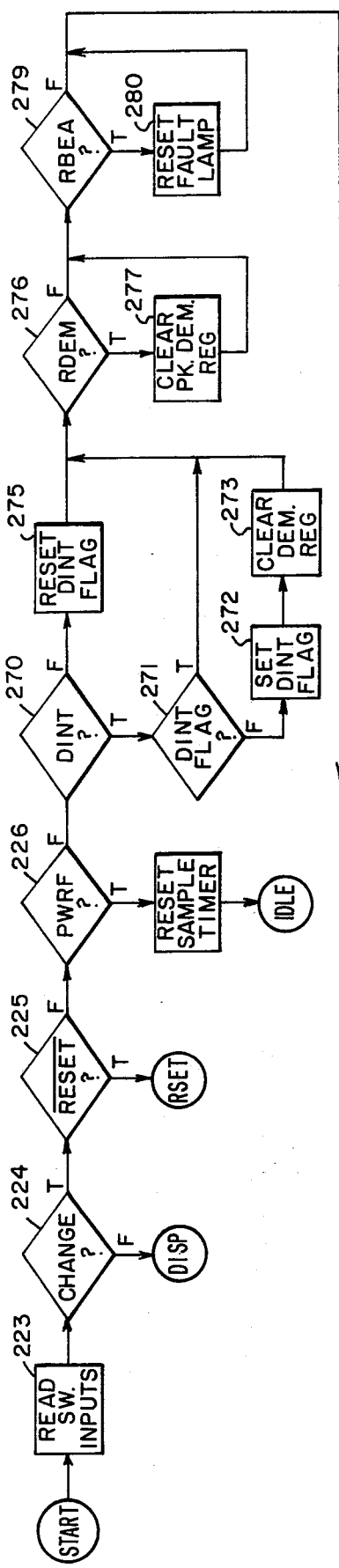
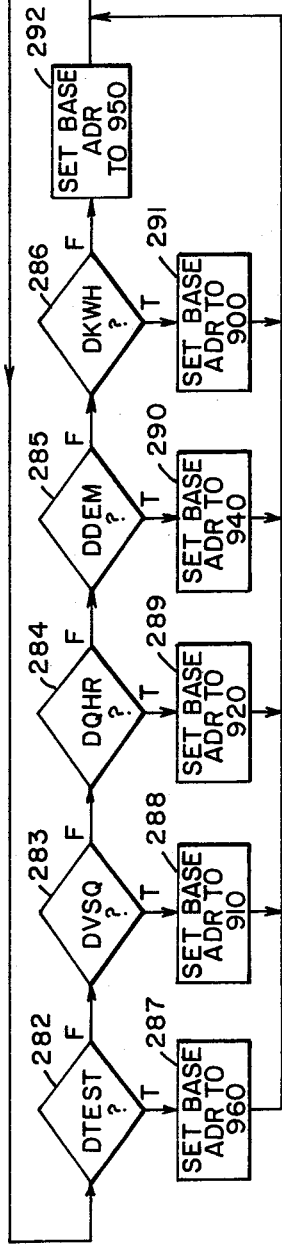
FIG. 6
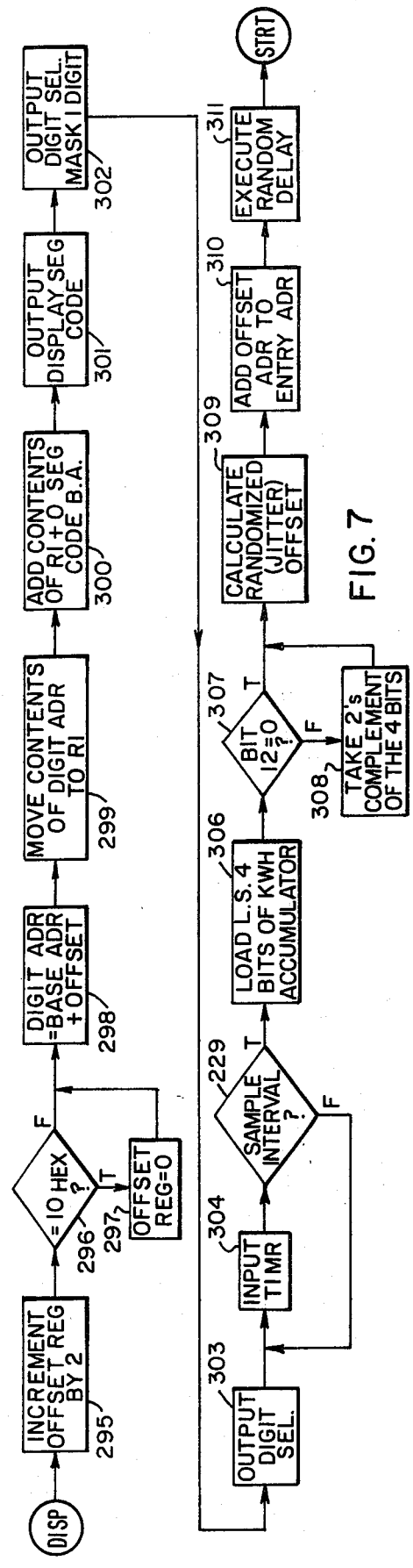
FIG. 7

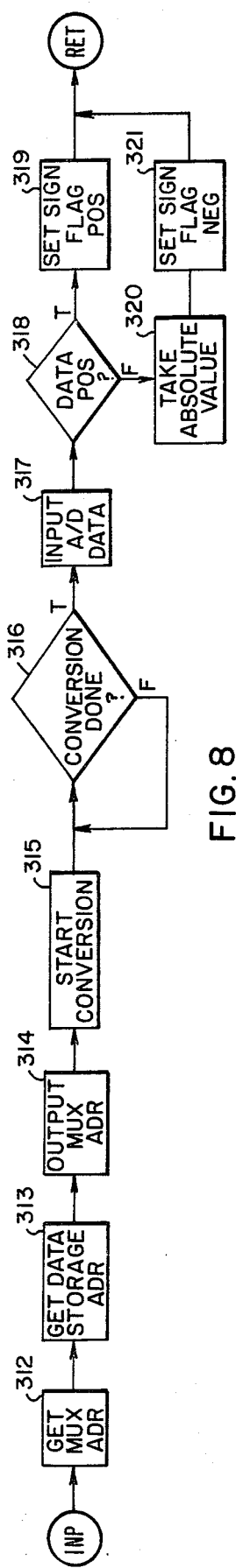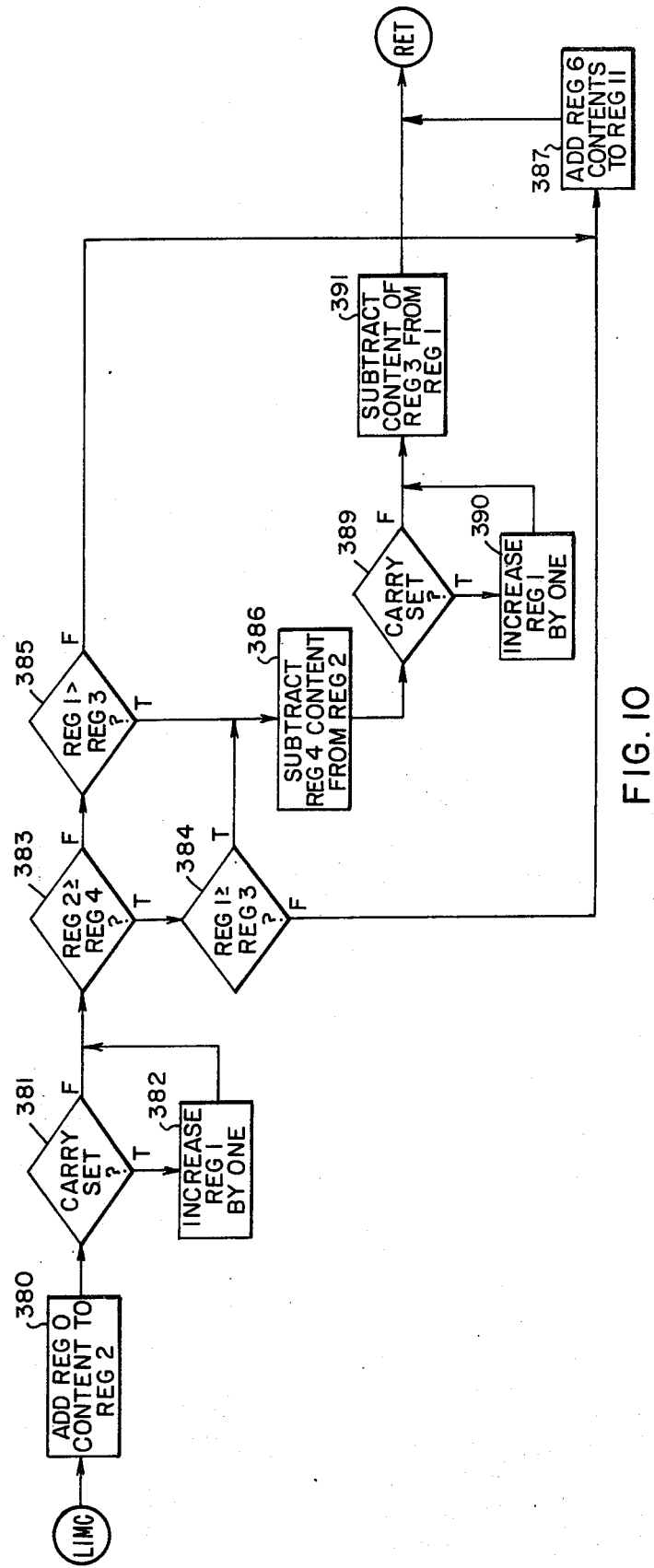
FIG. 8
FIG. 10

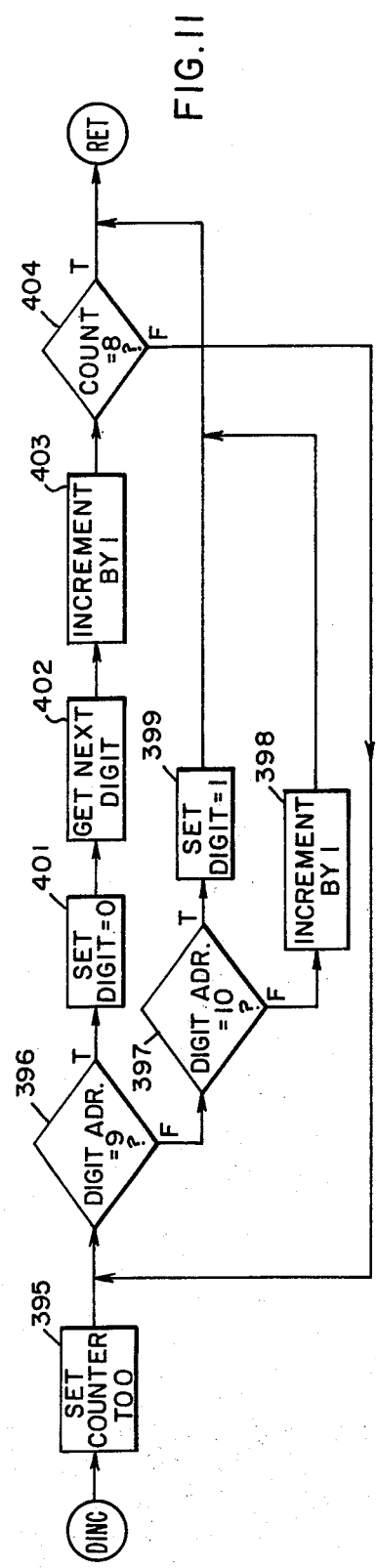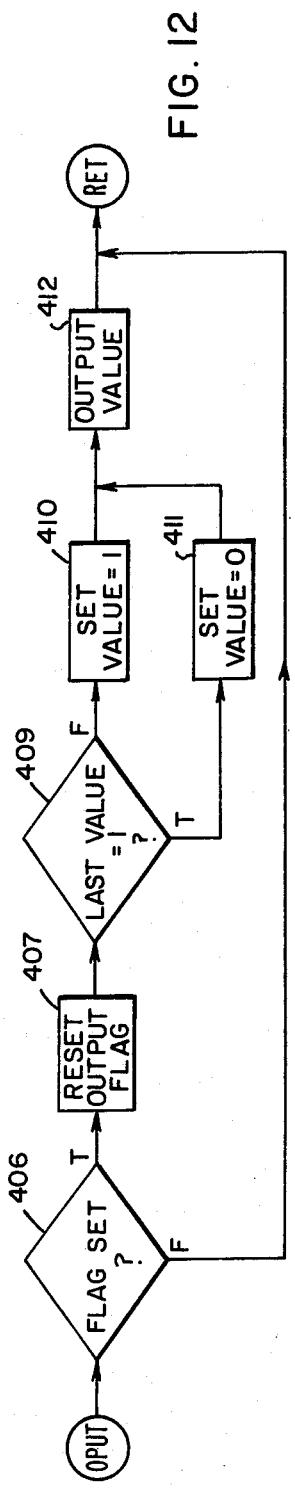

DIGITAL PROCESSING AND CALCULATING AC ELECTRIC ENERGY METERING SYSTEM

BACKGROUND OF THE INVENTION

1. Field of the Invention

The present invention relates to electric energy measurements for electric utility systems, and more particularly such measurements utilizing digital processing and calculations by programmed control of solid state circuits.

2. Description of the Prior Art

In the field of electric utility power and energy measurements, electromechanical induction type watthour meters have been the most extensive type in commercial use. Although many electronic measuring circuits are known, improvements in their accuracy, ruggedness, reliability and cost is desired.

Analog system multiplying circuit techniques have been chiefly used in the electronic power and electric energy measuring circuits to compute the product of the voltage and current components of an electric energy quantity to be measured. Power consumption or the electric energy usage in kilowatt-hours and kilowatt demand is required for billing purposes by an electric utility company and a computed power quantity must be calculated by the measurement circuits by deriving the product of voltage and current. The power quantity must be integrated with respect to time to produce kilowatt-hour measurements. It is further desirable to have circuits with the capability of measuring additional electric energy parameters of a power line system, such as reactive kilovolt-ampere hours, volts-squared hours and ampere-squared hours for load studies.

In one solid state measuring circuit described in U.S. Pat. No. 3,764,908 issued Oct. 9, 1973 and assigned to the assignee of this invention, voltage and current related signals are both applied to a semiconductor device having a logarithmic computing characteristic. Accordingly, an output signal is produced which is equal to the product of the input signals.

Another known analog multiplier technique includes time division multiplication. For example, a voltage signal is sampled to derive a pulse width modulated signal corresponding to the voltage amplitudes. The current signal is sampled at a rate controlled by the variable pulse width signal. An output is produced consisting of a series of pulses having a height proportional to the instantaneous current values and pulse width proportional to the instantaneous voltage values. The resultant signal is filtered to obtain an average value of the pulses which is, in turn, proportional to the instantaneous power. The average value signal is applied to a voltage-to-frequency converter utilizing integrating capacitors, for example. Variable frequency pulses of the converter are applied to a magnetic recorder or pulse totalizer formed by an electromechanical counter or electronic counting circuit. The accumulated pulses are representative of the electric energy kilowatt-hour consumption for billing or power analysis by an electric utility company. Electronic circuits for measuring different electric energy parameters are disclosed in U.S. Pat. Nos. 3,864,631, issued Feb. 4, 1975, and 3,778,794, issued Dec. 11, 1973, both assigned to the assignee of this invention.

It has been found that the analog electronic circuit techniques are sometimes difficult to apply in order to obtain the desired accuracies. Accurate drift-free analog multipliers are often expensive and it is further difficult to obtain square root computing circuits in the analog circuit field which are sometimes required for calculating electric power quantities. Also, analog integration circuits required in the analog electronic power measuring apparatus produce undesired drift and variations over long time intervals. In time division multiplication circuits it is known that frequency dependent sampling occurs at the multiplier with the associated digital integration also having similar dependency upon variations of integrating capacitors.

A more ideal approach to electric power measurements is to utilize digital processing techniques wherein voltage and current signals are sampled at very high rates, for example in the order of 1,000 times per cycle. The instantaneous sampled values would be quantized in high resolution analog-to-digital converters having a high order of bits provided in the binary representations of the digitizing outputs thereof. The time for the amplitude quantizations would be negligible and the speed of the digital processor circuitry would be sufficiently fast so that all of the calculations would keep up with the fast sampling rates.

The known advantages of an ideal digital approach, after the analog values have been converted to digital signals, is that there are no changes of accuracy occurring due to component drift and variations. Calculation of different electric power and energy parameters are more easily accomplished in digital circuits. The use of programmable read only memories permit flexibility in the measuring apparatus so that it is possible to accomplish many different functions without substantial changes in hardware.

The disadvantages of an ideal digital measuring apparatus include the use of analog-to-digital converters having very high speeds and high resolution which are rather expensive since these two characteristics are competing from a design standpoint due to the fact that more time is typically required to achieve higher resolutions in the quantizations. The higher resolution outputs of such converters produce higher order binary word lengths to represent the analog values so that that associated circuits become more complex and expensive. Further, digital processing circuits capable of operating at varying fast speeds are substantially more complex, expensive and require higher operating power supplies.

Alternatively, a digital processing power measuring apparatus capable of operating at slower sampling speeds and digitizing the instantaneous signal values with less resolution retains the advantages of the digital techniques including stability and flexibility at substantially lower cost. The reduction in resolution permits handling of shorter binary words with less bits for producing the digitized binary representations of the analog signal amplitudes. Slower sampling speeds permit digital processing at lower speeds to simplify the digital processing circuitry. However, the reduced sampling rates and lower digitizing resolution have a corresponding reduction in the accuracy of the digital representations of the sample amplitudes and a reduction in the true digital representation of each complete cycle of the input analog signals.

Examples of prior art patents generally disclosing the use of digital circuit techniques and digital calculations in power line and power measuring systems include U.S. Pat. No. 3,758,763, issued Sept. 11, 1973, disclosing a method of digitally processing AC signals utilizing a digital computer. Input AC power signal components are sampled and digitized at predetermined sampling times. A first sampled value is stored and then a second sampled value is obtained and the product of the two signals is derived to determine if the product has a negative sign, indicating that a zero crossing has occurred in the sampled signal. The disclosed system obtains frequencies, phase differences, powers and impedances of a power line network rather than measurement of electric energy parameters as in the present invention.

In U.S. Pat. No. 3,569,785, issued Mar. 9, 1971, a computer control system is disclosed for power system protective relaying, rather than for electric power measurement, in which the voltage and current components of an AC power line network are sampled and digitized and then applied to a computer for calculation of relaying control functions.

In measuring R.F. power, U.S. Pat. No. 4,011,509 issued Mar. 8, 1977, describes a digital measuring circuit that stores one digital power value and compares it to a measured power value to obtain a relative power value for expressing the measurement in decibels, not used in the subject invention.

Examples of electromechanical induction type watthour meter based metering packages having electric energy measurements produced that are closely related to the measurements produced in the present invention is the magnetic tape metering package designated as types WRS, WRR and WRP. The aforementioned types of metering packages are available from the Westinghouse Electric Corporation, Meter and Instrument Transformer Division, Raleigh, North Carolina. The metering packages include a load survey type magnetic recorder, and a combination of a polyphase watthour meter, a Q-hour meter, and a $V^2$-hour or $A^2$-hour meter wherein each meter is equipped with an electronic pulse initiator for producing output pulses responsive to rotation of the meter movements. The metering packages are designed to monitor a variety of typical electric utility services for load research or billing applications. The electric energy parameters that can be obtained from the metering package data outputs include kilowatt-hours, kilowatt-demand, reactive KVA hours, volts-squared hours or ampere-squared hours to provide a complete analysis of the electric energy quantity measured and electric load profile for a given metering installation. The data can be used for load research or cost of service data, or for operational data relating to feeder loading, billing equipment sizing and other uses by an electric utility company.

Although the aforementioned metering packages are satisfactory in many applications, they are bulky, subject to limitations in the flexibility of the outputs and different energy measurements obtainable because of the use of a plurality of induction type meter devices.

Accordingly, it is desirable to utilize the optimum advantages of digital processing and calculating techniques for AC electric energy measuring by optimum use of digital circuit arrangements operating at optimum signal processing rates while obtaining desired reliability and accuracy in the measured and calculated electric energy parameters.

SUMMARY OF THE INVENTION

A digital processing and calculating AC electric energy measuring system includes a sequence controller and calculator subsystem for controlling the metering system operations in accordance with a predetermined stored program. An analog input of the system receives voltage and current signal components of an electric energy quantity supplied through a electric utility power line system and to be measured by the metering system. Instantaneous sample values of the voltage and current signals are obtained at randomized sampling times to increase the accuracy of the metering system and to provide optimum utilization of the digital electronic circuits used. The instantaneous signal values are sequentially digitized at a single A/D converter. A readout display output produces numerical readings of a plurality of electric energy parameter measurements. A plurality of output pulse data signals representing the measurements are produced to a pulse receiver device capable of transmitting the data pulses through a remote metering telemetry system or for being recorded in a magnetic recorder type of receiver device. Input and output (I/O) interfaces pass binary representations of the input signal samples, binary logic control and system monitoring system signals and data output signals between the system inputs and outputs and the sequence controller and calculator subsystem.

The system sequence controller and calculator subsystem includes a microprocessor subsystem having programmable read only memory (PROM) and random access memory (RAM). The programmed sequence of operation of the metering system and the system constants are stored in PROM. The stored system constants include limit values of the electric energy parameters to be measured so that upon the calculated values being incremented to the limit values, an output pulse data signal is produced representing a predetermined quantum of a measured parameter. RAM provides temporary storage of the system constants as well as temporary data and scratch pad or work space storage. A plurality of parameters of the electric energy quantity to be measured are calculated in a common calculation program subroutine digitally operating on the instantaneous signal values in binary repesentations. The system calculates $\Delta$ increments of kilowatt, Q and volts-squared. Incrementing each of these calculations produces the value of the time integral of the measured electric energy parameters. Demand interval pulses are received in the system to determine peak power usage or kilowatt demand by accumulating the maximum of the kilowatt-hour calculations occurring during demand intervals established between the demand interval pulses.

The accumulated values of the calculated parameters are compared to the limit values, and when a limit value is reached, an output pulse data signal is initiated. The calculated parameters are incremented in binary coded decimal (BCD) formats in BCD accumulator memory registers. The accumulated BCD binary signals are readily available for direct input to the readout display device to produce numerical readings, in real time, of the measured energy parameters. The BCD format of storage eliminates extra decoding circuitry required for binary to BCD code conversions for the display input.

A sample timer circuit utilizes the sequence controller and calculator subsystem clock source for producing sample interval timer (TIMR) pulses which initiate each randomized sampling interval. The TIMR pulses produce random time periods in the sampling intervals which vary about a predetermined average time period for the sampling intervals. TIMR pulses are sensed by the sequence controller and calculator subsystem. A random delay is produced between the beginning of each TIMR pulse and the time that a sample and hold control (HOLD) pulse is initiated at a sampling time whereupon an input signal amplitude is sampled and held for digitizing. A predetermined delay period is quantized in the programmed operation of the system controller and calculator subsystem and the beginning of each TIMR pulse effects selection of one of a predetermined sequence of randomly occurring numbers which correspond in number to the predetermined number of delay period quanta. The randomized sampling intervals are produced so as to have the predetermined sampling interval average time after a substantial number of the random sampling intervals occur.

The metering system includes manual controls for selection of one of the measured parameters to be displayed, for resetting at the beginning of each kilowatt demand measuring period and for master resetting of the metering system.

A power supply for the metering system receives primary power from a conventional 120 VAC electric source to produce regulated DC voltages to the system solid state circuits. Monitoring of the regulated power supply output voltages and primary power outage detecting are provided in the power supply. Momentary power supply output carryover is provided so that when the sequence controller and calculator subsystem is of a microprocessor type, as in one preferred embodiment, the subsystem can be returned to a known position in the system program in preparation of an extended power outage condition. Battery carryover power is further provided so as to preserve RAM stored information including the system constants and the temporary data and scratch pad storage therein during an extended power outage condition.

Accordingly, it is a general feature of this invention to provide an electric energy metering system for producing binary representations of instantaneously sampled values of input voltages and currents and to provide digital processing and calculating based on the binary representations to avoid undesired variations produced in analog signal processing measurement systems. A further general feature is to provide optimum utilization of digital processing and calculating circuits including randomized signal sampling to produce a desired accuracy in the measurements of different parameters of an AC electric energy quantity supplied through an electric utility system, and especially to provide measurements of the electric energy parameters for polyphase electric energy quantities.

BRIEF DESCRIPTION OF THE DRAWINGS

FIGS. 3A and 3B illustrate portions of a power supply circuit shown in FIG. 1;

FIG. 4 is a pulse timing diagram illustrating control of the randomized signal sampling operation included in the system shown in FIGS. 2A and 2B;

FIG. 6 illustrates a flow diagram of a START and Switch Input program routine designated in the flow diagram shown in FIG. 5;

FIG. 7 illustrates a display (DISP) routine designated in the flow diagram shown in FIG. 5;

FIG. 8 illustrates a A/D converter input (INP) routine designated in the flow diagram shown in FIG. 5;

FIG. 10 illustrates a limit comparison (LIMC) subroutine designated in the flow diagram shown in FIG. 5;

FIG. 11 illustrates a display register increment (DINC) subroutine designated in the flow diagram shown in FIG. 5; and FIG. 12 illustrates an output pulse (OPUT) subroutine designated in the flow diagram shown in FIG. 5.

Appendix A is included showing a program listing of the sequence of operation of the system of this invention as an aid in understanding the operation of this invention; however, it is believed that the drawings and description of the preferred embodiment of this invention are adequate for an understanding of the present invention.

DESCRIPTION OF THE PREFERRED EMBODIMENT

Figure 1:
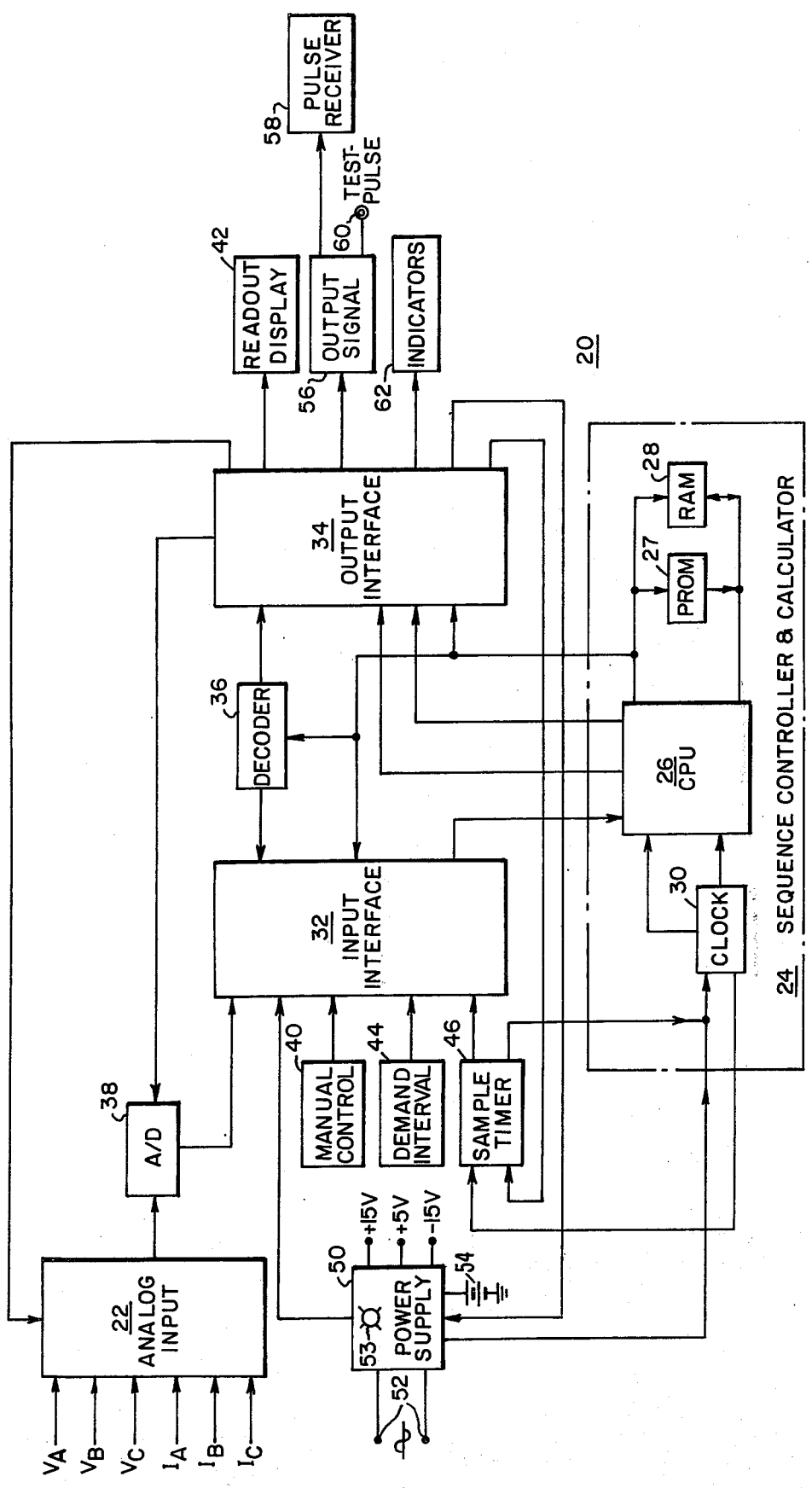
FIG. 1 illustrates a block schematic diagram of the digital processing and calculating AC electric energy metering system of this invention.

Referring now to the drawings, and more particularly to FIG. 1 there is shown a block schematic diagram of the digital processing and calculating AC electric energy metering system 20 made in accordance with the present invention. An analog input 22 receives input analog signals formed by the voltage components $V_A$, $V_B$, $V_C$ and current components $I_A$, $I_B$, $I_C$ included in three phases $\phi A$, $\phi B$, $\phi C$ of an AC electric energy supply network such as formed by the transmission or distribution network of an electric utility company. The analog inputs are assumed to be sinusoidal with a nominal power line frequency of sixty Hz. as typically supplied by a utility company. The component signals $V_A$, $V_B$, $V_C$, $I_A$, $I_B$, and $I_C$ are produced by conventional potential and current transformers, not shown, coupled to the transmission or distribution network, also not shown. The system 20 senses the voltage and current component signals and calculates a plurality of electric energy parameters of the polyphase electric energy quantity supplied to a customer's electrical loads and to be measured for billing, load survey and other analysis desired by an electric utility company.

A sequence controller and calculator subsystem 24 controls a programmed sequence of operation of the system 20 and includes a central processing unit (CPU) 26 of a microprocessor type described further hereinbelow. Address and data input and output lines of the CPU 26 are connected to read only memories (PROM) 27 and random access (read and write) memories (RAM) 28. A clock source 30 supplies clocking signals to both the CPU and to the system and also supplies a system logic control signal described further hereinbelow.

Input and output (I/O) interfaces 32 and 34, respectively, partially controlled by an associated address decoder 36, channel digital data and binary logic control signals into and out of the CPU 26 in response to addresses to the input and output interfaces 32 and 34 from the subsystem 24. An analog-to-digital (A/D) converter 38 supplies input digital data to the input interface 32 in the form of binary representations of instantaneous values of the six analog input signals. The analog input 22 simultaneously samples each of the six analog input signals and the instantaneous values are sequentially applied to the single A/D converter 38 for digitizing of all the signal samples. The sampling intervals are varied in a random fashion by control signals from the output interface 34. Upon completion of each digital conversion at the converter 38, the input interface 32 is addressed and applies the digitized data signals to the CPU 26.

Additional binary logic control inputs to the input interface 32 are applied from a manual control 40 including switch controls for selecting a desired one of the plural measured energy parameters to be displayed at a readout display 42. Numerals displayed at the readout display are produced by control signals from the output interface 34 for visually indicating the latest calculated value of the energy parameter of the three phase electric energy quantity being measured. The system 20 measures three phase kilowatt-hours (KWH), kilowatt demand (KWD), Q-hour (QHR), and the volts-squared-hours ($V^2H$). The aforementioned electric energy parameters are typically used by electric utility companies for load research or cost of service data, operational information on feeder loading, billing equipment sizing and many other applications.

A demand interval control 44 is applied to the input interface 32 in the form of demand interval pulses which are understood by those skilled in the art as to be regular intervals of fifteen or thirty minutes, for example, used to determine the peak kilowatt demand during an established billing period. A sample timer 46 receives clock signals from the clock source 30 and includes a counter circuit arrangement described further hereinbelow for producing control signals to the input interface 32 used to establish the sampling times when the instantaneous values of the analog input signals are detected and held in the analog input 22. Signals from the output interface 34 are utilized to reset the sample timer 46 after it has initiated a sampling interval. A further control signal from the sample timer 46 is applied to the clock 30 to indicate the failure of the sample timer to initiate another sampling interval and to restart the system by initially resetting the CPU 26 and causing the sequence controller and calculator subsystem 24 to re-initialize the system under the assumption that the correct program sequence has been lost and the system is required to recover by the failure of initiate a sampling interval.

A power supply 50 is connected to a primary source of 120 VAC at the input 52 of the power supply. The indicated plus and minus 15 volts and plus five volts DC are produced to supply the required direct current voltages to the solid state circuit elements of the system 20. An indicator light 53 indicates that the input power is being received and the regulated direct current voltages are being supplied to the system 20. The system power light 53 is preferably mounted at a forward exposed location in a housing containing the system 20. The power supply 50 is heavily filtered to provide sufficient energy storage so that 30 to 50 milliseconds of carryover power supply output is furnished in case of a primary power input interruption before the power supply circuit will go out of regulation. As described further hereinbelow, the power supply circuit 50 supplies a signal to the input interface 32 indicating that there has been an interruption in the input power for longer than approximately twenty milliseconds. A battery 54 is included in the power supply circuit 50 and is normally charged by the input 52 and upon a power outage for longer than approximately twenty milliseconds, the battery 54 will supply five volts to RAM 28 to preserve the stored information therein during the power outage. The PROM 27 does not require the battery power carryover since they are of a permanently programmed type having permanent data and program storage. Upon loss of regulated power at the power supply circuit 50 and indication of such, a further signal is initiated at the output interface 34 and to the power supply 50. A control signal from the power supply to the clock source 30 resets the CPU 26 to stop system operation and carryover power is supplied from the battery 54 to the RAM 28.

Output signals 56 are produced from the output interface 34. A pulse output signal is produced for a predetermined quantum of a measured in parameter of an electric energy quantity. Accordingly, KWH, QHR and $V^2H$ pulses are produced for reception at a pulse receiver 58. The output signals may be encoded for remote transmission or are capable of activating a three wire telemetry system, pulses totalizing devices, pulse recorders and the like. In the preferred embodiment of the system 20 the pulse receiver 58 includes a multichannel magnetic tape recorder which simultaneously records time pulses corresponding to the demand metering intervals. A test-pulse output 60 provides test pulses useful in calibration and testing of the system 20. Finally, the output interface 34 produces outputs to indicators 62, indicating the status of the system 20 in addition to the system power fail light 53 associated with the power supply circuit 50.

Figure 2A:
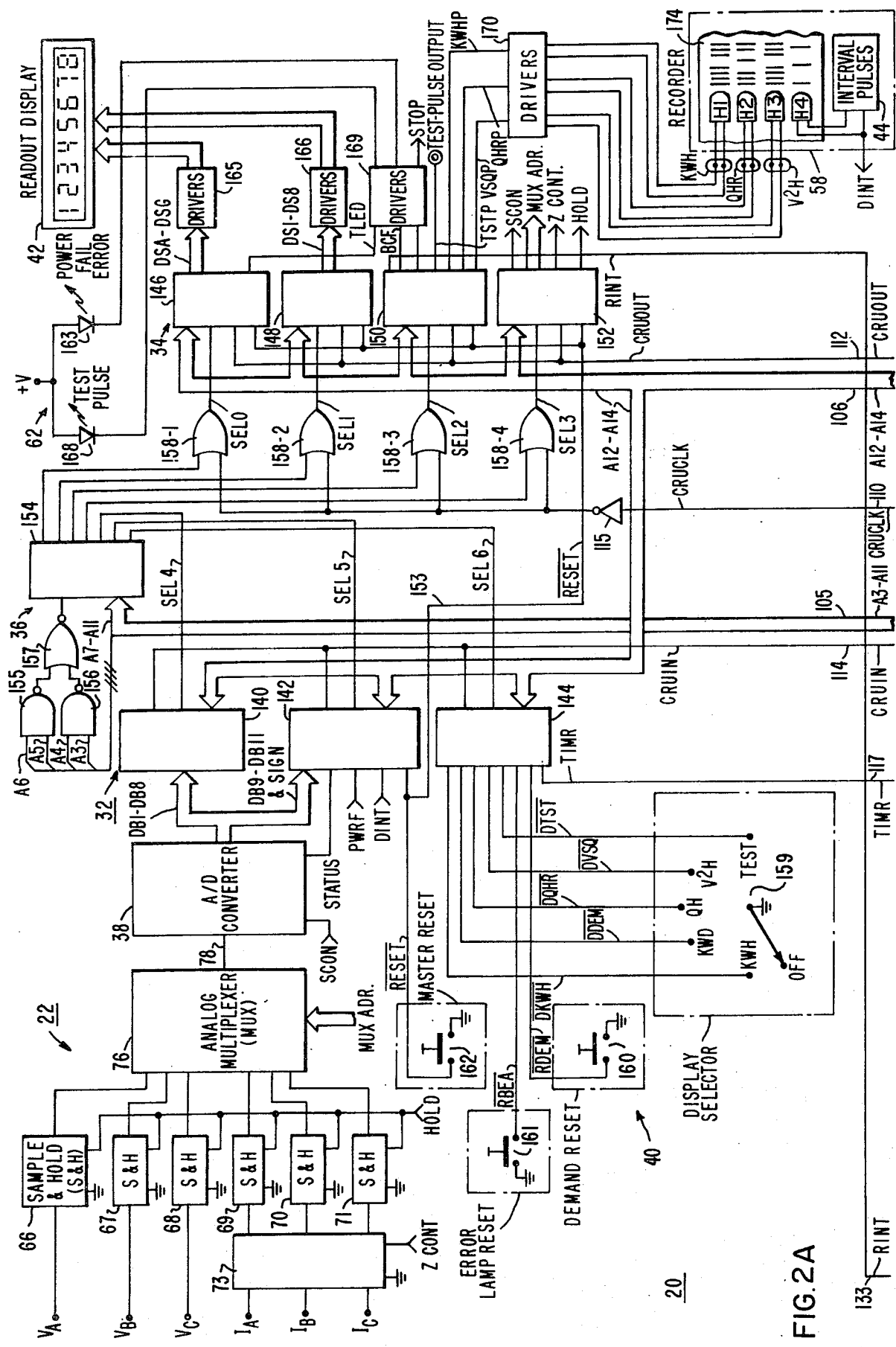
FIGS. 2A and 2B illustrate an electrical circuit diagram of the system shown in FIG. 1.
Figure 2B:
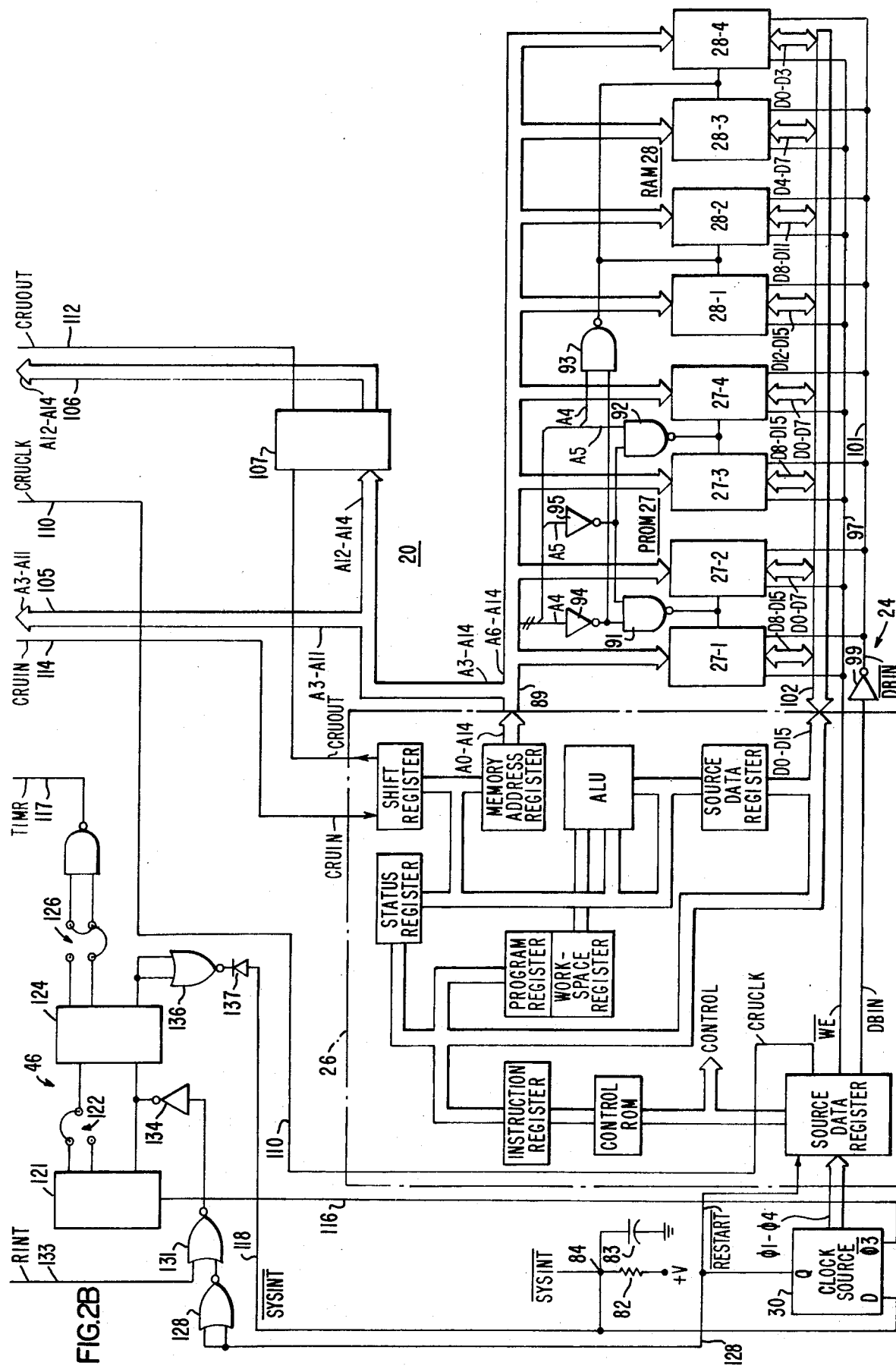

Description of FIGS. 2A and 2B

Referring now to FIGS. 2A and 2B wherein there is shown an electrical circuit diagram of the digital processing and calculating AC electric energy measuring system 20, the system 20 is shown in detail and corresponds to the general block diagram of FIG. 1 described hereinabove in connection with the general description of this system. To aid in understanding of the FIGS. 2A and 2B, the binary logic control and data signals shown in FIG. 2A are set forth in the following Tables I and II, describing the system interface inputs and system interface outputs, respectively. The program address, signal name and description are included in each of the tables to aid in the explanation and description of FIGS. 2A and 2B.

TABLE I

| Address | Name | System Interface Inputs Description |
|---|---|---|
| 1 E 40 | DB1 | A/D Data Bit 1 (LSB) |
| 2 | DB2 | A/D Data Bit 2 |
| 4 | DB3 | A/D Data Bit 3 |
| 6 | DB4 | A/D Data Bit 4 |
| 8 | DB5 | A/D Data Bit 5 |
| A | DB6 | A/D Data Bit 6 |
| C | DB7 | A/D Data Bit 7 |
| E | DB8 | A/D Data Bit 8 |
| 1 E 50 | DB9 | A/D Data Bit 9 |
| 2 | DB10 | A/D Data Bit 10 |
| 4 | DB11 | A/D Data Bit 11 |
| 6 | SIGN | A/D Sign Data Bit |
| 8 | STAT | A/D Status |
| A | PWRF | Primary Power OFF |
| C | DINT | Demand Interval Pulse |
| E | RESET | Master Reset Switch |
| 1 E 60 | DTST | Display Test Switch |
| 2 | DVSQ | Display Volts-Squared Hour Switch |
| 4 | DQHR | Display Q-Hour Switch |
| 6 | DDEM | Display KWH Demand Switch |
| 8 | RDEM | Demand Reset Switch |
| A | RBEA | Battery Carryover Error Reset Switch |
| C | DKWH | Display KWH Switch |

TABLE I-continued

System Interface Inputs

| Address | Name | Description |
|---|---|---|
| E | TIMR | Sample Interval Timer Pulse |

TABLE II

System Interface Outputs

| Address | Name | Description |
|---|---|---|
| E 0 0 | SCON | Start MUX Conversion |
| 2 | ADR0 | MUX Address Bit |
| 4 | ADR1 | MUX Address Bit |
| 6 | ADR2 | MUX Address Bit |
| 8 | ZCONT | Current Amplitude Input Control |
| A | HOLD | Sample and Hold Control |
| C | — | |
| E | — | |
| E 1 0 | DSA | Digit Segment A |
| 2 | DSB | Digit Segment B |
| 4 | DSC | Digit Segment C |
| 6 | DSD | Digit Segment D |
| 8 | DSE | Digit Segment E |
| A | DSF | Digit Segment F |
| C | DSG | Digit Segment G |
| E | TLED | Test Pulse Ind. Output |
| E 2 0 | DS8 | Digit Select 8 |
| 2 | DS7 | Digit Select 7 |
| 4 | DS6 | Digit Select 6 |
| 6 | DS5 | Digit Select 5 |
| 8 | DS4 | Digit Select 4 |
| A | DS3 | Digit Select 3 |
| C | DS2 | Digit Select 2 |
| E | DS1 | Digit Select 1 |
| E 3 0 | RINT | Sample Timer Reset |
| 2 | KWHP | KWH Output Pulse |
| 4 | QHRP | QHR Output Pulse |
| 6 | VSQP | Volts-Squared Output Pulse |
| 8 | BCF | Battery Carryover Failure |
| A | STOP | Reset CPU |
| C | — | |
| E | TSTP | Test-Pulse Pulse Output |

The analog input 22 includes six sample and hold (S&H) circuits 66, 67, 68 and 69, 70 and 71. Each of the circuits is a sample and hold circuit type AD 583 available from Analog Devices Inc., Norwood, MA 02062. The three phase voltage signal component $V_A$, $V_B$, and $V_C$ of a power line network being monitored are applied to the analog signal inputs of the circuit 66, 67 and 68, respectively. The S&H circuit output signal voltages all have a nominal ± 5 voltage range in one preferred embodiment. The HOLD binary logic control signal is applied to each of the sample and hold circuits 66, 67, 68, 69, 70 and 71. The logic one places the sample and hold circuits in the hold condition to maintain the sampled instantaneous value of the input signals at the outputs. The sampling time occurs at the time of the zero to one logic state transition of the HOLD signal. The logic zero of the HOLD signal permits the sample and hold circuit outputs to track or follow the circuit inputs. The three phase current signal components $I_A$, $I_B$ and $I_C$ are conditioned to have a 0 to 10 ampere range at the inputs of an analog multiplexer 73. The multiplexer is a triple 2 Channel Analog multiplexer type 14053 available from the CMOS Division, Motorola Semiconductor Products Inc. The current analog input signals pass through the analog multiplexer 73 when the ZCONT binary logic control signal has a logic one state to be applied to the analog inputs of the sample and hold circuits 69, 70 and 71. When ZCONT has a logic zero, the three input current values are held at the analog ground value or a zero reference level to calibrate and adjust for any drift or variations in the sensing of the sensed current values. Accordingly, the instantaneous values of the three current inputs are developed at the respective sample and hold circuit outputs, as described hereinabove for the voltage sample and hold circuits. It is to be understood that the signal values of signals $V_A$, $V_B$, $V_C$, $I_A$, $I_B$ and $I_C$ are developed with respect to the analog signal ground and have a predetermined proportional relationship to the voltage and current components of the three phase electric energy quantity to be measured.

The sample and hold circuits designated 66 through 71 include a 0.01μf capacitor temporary storage circuit controlled by the HOLD input signals. These HOLD signals are produced in response to the sample timer 46 under control of the CPU 26, as described further hereinbelow to establish and define the sampling intervals at which time the instantaneous amplitudes of the analog input signals are detected for digitizing. The instantaneous values of the analog signals at the time of the HOLD signal is held on the associated capacitor, not shown, while each sampled value is sequentially applied to the A/D converter 38.

An analog multiplexer (MUX) 76 receives each of the sample and hold circuit analog outputs and is provided by an eight Channel Analog Multiplexer type 14051 available from the aforementioned Motorola Semiconductor Products Inc. The instantaneous sampled signal values are each sequentially applied to the multiplexer output line 78 in response to a three bit binary address input applied by the MUX ADR address bus including the address signals ADR0, ADR1 and ADR2 from interface 34. The aforementioned MUX ADR address bits have a positive true state. Each of six different coded addresses connects a different one of the multiplexer inputs and therefore a different one of the sample and hold circuit outputs to the multiplexer output 78.

The A/D converter 38 is preferably formed by a 12-bit A to D Converter type 572 available from the aforementioned Analog Devices Inc. The converter 38 digitizes the instantaneous signal values applied to the converter input from the multiplexer output line 78. The binary coded A/D converter output is formed by the twelve data bits designated DB1 through DB11 plus SIGN bit shown in Table I. The converter is arranged so that the eleven bit signals are representative of one of 2,048 quantizing bit levels of the analog input instantaneous values. The twelfth SIGN bit has a zero logic indicating positive data and a one logic state representing a negative data output to indicate positive and negative phases at the analog input signals.

The converter 38 further includes a start conversion SCON control input and begins digitizing the level of the received input analog signal when SCON has a high true logic one level. The converter circuit begins digitizing and initiates a STAT signal having a logic one to logic zero transition indicating the completion of the digital conversion.

Operation of the analog multiplexer circuit 73 at the current inputs includes a signal drift compensation feature. Errors in the sensed levels of the analog current signals are capable of producing errors in the computation of the energy parameters in some applications of the system of this invention. As is known, the input current signal values will change with changes in the supplied electric load while the input voltage signals will remain relatively constant. Accordingly, when a ZCONT signal is present, all of the current signal inputs are tied to the analog reference zero level. These three current signals are sequentially passed through the MUX 76 to the converter 38 where the values are digitized. If the system variations produce other than zero binary outputs at the data outputs of the converter 38, then it is known that the variations are producing errors in the digitized current signals. These variations from the zero reference establish an error offset value which is stored and used by the sequence controller and calculator subsystem 24 to correct the sensed current signals converted thereafter when the ZCONT releases the multiplexer 73.

The sequence controller and calculator subsystem 24 is now described before describing the remaining portions of the system 20 shown in FIGS. 2A and 2B. The subsystem 24 is formed by a microprocessor based system wherein the CPU 26 includes a type TMS 9900 sixteen bit microprocessor available from the Semiconductor Group, Texas Instruments Inc., Dallas, Texas 54222. The CPU 24, clock source 30 and PROM and RAM memories 27 and 28 form a TMS 9900 microprocessor subsystem described in the TMS 9900 Microprocessor Data Manual, 1976; the Minimum System Design TMS 9900 16-bit Microprocessor Application Report, Bulletin CA-184; and the Model 990 Computer/TMS 9900 Microprocessor Assembly Language Programmer's Guide, available from the aforementioned Texas Instruments Inc. The general architecture of the microprocessor CPU 24 is shown in FIG. 2B as generally utilized in the present invention and will not be described herein since the aforementioned publications disclose the use and operation of the microprocessor subsystem as it is available for use in the system 20.

The subsystem 24 includes, besides the microprocessor CPU 26, a clock source 30 formed by a type SN74LS362 clock generator available from the Texas Instruments Inc. including a forty-eight MHz crystal controlled oscillator providing four phase clock signals, $\phi1$, $\phi2$, $\phi3$, and $\phi4$ clock signals to the CPU as shown in FIG. 2B. As described in the aforementioned publications, the clock source 30 has associated therewith an LC network formed by the resistor 82 and capacitor 83. The junction 84 between the resistor and capacitor is connected to the D input of a Schmitt-triggered logic circuit in the clock source 30 with the other terminal of the capacitor connected to the system ground. The other end of the resistor 82 connected to positive five volts. When the clock D input is brought low, a power-on reset is applied to the CPU microprocessor pin six. The Q logic output at the clock source is labeled $\overline{\text{RESTART}}$ in FIG. 2B which has a low true logic zero state effective to synchronize the CPU and to reset and initialize the CPU 26 at the power-turn reset. The line designated $\overline{\text{RESTART}}$ is the same as described as $\overline{\text{RESET}}$ in the aforementioned TMS 9900 Microprocessor pin functions to produce the CPU reset as described in the aforementioned publications.

The PROM 27 is formed by four separate type SN 745472 bipolar 512 × 8 bit PROMs, also available from the aforementioned Texas Instruments Inc., for permanent data and program storage. The four circuits in PROM 27 are designated by the numerals 27-1, 27-2, 27-3, and 27-4 in FIG. 2B. The PROM 27 provides for up to 1,024 × 16 bit words of permanently stored programmable memory. The RAM 28 includes an array of type TMS 4042-CMOS RAM's designated by the numerals 28-1, 28-2, 28-3 and 28-4. The circuits in RAM are organized in a 256 × 16 bit pattern to provide temporary data storage and work space register areas.

The memory interface of the CPU 26 includes an address bus 89 which outputs address bits A3 through A14 (LSB) in which the bits A6 to A14 are applied to the four PROM circuits 27-1 through 27-4 in parallel. The parallel address arrangement permits the selection of one of the five hundred twelve words in each PROM memory circuit to be accessed. The address bits A4 and A5 are decoded by the decoder logic including the NAND gates 91, 92 and 93 and the inverter gates 94 and 95 in which the NAND gate outputs are connected to the pairs of PROM circuits 27-1 and 27-2, 27-3 and 27-4 and RAM circuits 28-1 and 28-2, and 28-3 and 28-4, as shown in FIG. 2B. The address bits A4 and A5 are decoded by the memory select logic to simplify the addressing to the PROM 27 and RAM 28. A $\overline{\text{WE}}$ (write enable) is applied to each of the RAM circuits on line 97 and DBIN (CPU data bus in) is applied through an inverter circuit 99 in line 101 to provide a $\overline{\text{DBIN}}$ signal also to each of the RAM circuits 28-1 through 28-4.

The CPU further includes a data bus 102 including the data bits D0 through D15 (LSB) which comprise a bidirectional three state data bus. The bus 102 transfers memory data to (when writing) and from (when reading) the PROM 27 and RAM 28. The data bits D8 through D15 are connected with the PROM memory circuits 27-1 and 27-3 and the remaining eight data bits D0 through D7 are connected with PROM circuits 27-2 and 27-4. Four data bits D12 through D15 are connected with RAM circuit 28-1, data bits D8 through D11 with RAM circuit 28-2, data bits D4 through D7 with RAM circuit 28-3 and the remaining four data bits D0 through D3 are connected with the RAM circuit 28-4.

Address bits are also applied from the CPU 26 externally of the subsystem 24 in address buses 105 and 106. The bus 105 includes address bits A7 through A11 and is outputted to the decoder 36. The bus 106 includes the three address bits A12, A13 and A14 and are applied through a bus driver 107 being of a type SN 8216. The address bus 106 from the bus driver 107 is applied to the input interface 32 and the output interface 34 in FIG. 2A for purposes which will be described further hereinbelow.

The remaining outputs from the CPU 26 include the three microprocessor dedicated signals CRUCLK (CRU clock) provided on the line 110, the signal CRU-OUT (CRU data out) provided on the line 112, and the signal CRUIN (CRU data in) provided on the line 114. Data is applied on the line 114 to the CPU 26 in a serial bit fashion and the CPU tests an input bit by placing the bit address on the address bus and then testing CRUIN to receive input data from the input interface 32. The CPU sets or resets an output bit by placing the bit address on the address bus, the output data bit on CRU-OUT; and a clock pulse on CRUCLK. The data on the CRUOUT line 112 appears as serial data and is sampled by the output interface 34 when the CRUCLK signal is in a high or logic one state. The CRUOUT line 112 passes through the bus driver 107 and is applied to the output interface 34 and the CRUCLK line 110 passes through an inverter 116 to the output interface 34 to clock the data on line 112 into the output interface 34 as described more fully hereinbelow.

The sample timer circuit 46, shown in FIG. 2B is now described since it is controlled by one of the TTL compatible clock pulses produced on line 116 at a 3.0 MHz. from the clock source 30. The sample timer circuit 46 produces the TIMR signal on the timer output line 117 to control the randomized sampling intervals in the sample and hold (HOLD) signals applied to the analog input 22 as described in the description of FIG. 4. A first SYSINT signal is produced on a second timer output line 118. The SYSINT signal has a true low logic condition as connected to the D logic input of the clock source 30 to initiate a RESTART from the clock source 30 when the normal time for the TIMR signal to occur has passed without its occurrence. The SYSINT signal is provided under the assumption that the correct program sequence has been lost since the TIMR signal did not occur and the subsystem 24 is required to recover.

The sample timer circuit 46 includes pulse counter arrangement including a divide-by-sixteen counter type SN 74LS93, available from the aforementioned Texas Instruments Inc., designated by the numeral 121 receiving at a clock input the clock signals on line 116. The two outputs to pad connections 122 provide divide-by-four and divide-by-eight outputs and are brought out to the pad connections where they are selected by a jumper for applying alternative output pulse rates to a counter 124 formed by a fourteen stage binary counter type CD 4020 counter. The clock input of the counter 124 is divided by factors of 512, 1024 and 4096 at the three counter outputs 119-1, 119-2 and 1193 and the first two outputs are made available at pad connections 126 having associated jumpers as shown. Selection of one or a combination of two of the available outputs of the counter 124 is made for input through the two inputs of NAND gate 127. A series of negative going TIMR pulses are produced on the line 117 at the out of the gate 127. The pulse periods can be varied from approximately 1.5 to 3.0 milliseconds by alternate connections at the pad connections 122 and 126. The TIMR pulse signal is applied through the interface 32 to the subsystem 24 to signal the beginning of a sampling interval. The alternate connections at the counters 121 and 124 provide for variations in the time period of the sampling intervals formed between consecutive sampling times.

A resetting control input to the sample timer 46 is connected to line 128 and includes a NOR gate 129 having both inputs connected to the RESTART line 128 so as to invert the logic of the line 128. A second NOR gate 131 receives one input from the gate 128 and a second input from the RINT signal line 133. The output of the gate 131 is applied through an inverter 134 to the reset inputs of the counters 121 and 124. When the subsystem 24 detects the beginning of a sampling interval, the RINT signal goes high at the output of the output interface 34 to reset the timer counter arrangement to zero. The lowest output of counter 124 is applied to both inputs of a NOR gate 136 having an output connected through the diode 137 to the line 118 to produce the SYSINT signal to the clock input. So long as the counter is regularly reset by the RINT signal, the output of the NOR gate 136 will remain high. The period of the pulses applied to the gate 136 from the lowest output shown for the counter 124 is, as in one preferred embodiment, approximately twice the time between the periods of the TIMR pulses at the output of the NAND gate 127 so that if a TIMR signal is not produced for a time approximately twice that taken for normally providing the signal on line 117, the SYSINT is produced at the output of gate 136. This produces a RESTART signal which resets the CPU 26. Since the RESTART signal is applied to the NOR gate 128, the sample timer is also reset when the SYSINT is initiated by the gate 136, and in turn is released when the RESTART is applied to the sample timer 46.

The input and output interfaces 32 and 34 and the associated address decoder 36, providing an I/O interface chip addressing operation, is now described as shown in FIG. 2A. The interface 32 includes three eight line to one line tri-state octal multiplexers designated by the numerals 140, 142 and 144. The octal multiplexers are of a type SN 74LS251, available from the aforementioned Texas Instruments Inc. The single output of the octal multiplexers 140, 142 and 144 are connected in parallel to the CPU data input line 114. Since the multiplexers each have eight inputs, the twenty four system input interface signals can be applied to the multiplexer inputs which define the input ports of the I/O interfaces 32 and 34 for input to the CPU input CRUIN. The CPU address bits A12, A13, and A14 are applied in parallel to the multiplexers 140, 142 and 144 from the bus 106. An enabling input of each of the multiplexers receives the chip select signals SEL4, SEL5 and SEL6, respectively, from the address decoder 36. One of the three circuit chips defining the multiplexers 140, 142 and 144 is enabled by one of the select signals SEL4, SEL5, and SEL6 so that the three bit address effects output of one of the eight system inputs to the data line 114.

The output interface 34 includes four addressable latches 146, 148, 150 and 152. The addressable latches are a type SN 74LS259 available from the aforementioned Texas Instruments, Inc. Three bit address inputs of the latches are connected in parallel to the bus 106 which applies the CPU address bits A12, A13 and A14 from the driver 107. The CPU data output line 112 applies the data out signals CRUOUT to the data inputs of the latches in the output interface 34. Reset inputs of the latches 146 through 152 are connected to the line 153 having the RESET signal which is developed when the system is manually reset, as described further hereinbelow. Enabling inputs of the latches 146, 148, 150 and 152 receive the chip select/clock signals SEL0, SEL1, SEL2 and SEL3 from the address decoder 36. The eight outputs from each of the four latches define output ports of the I/O interfaces 32 and 34 of the system 20 and provide the system output signals listed and described in the aforementioned Table II and shown at the outputs of the interface 34 in FIG. 2A. When one of the SEL0, SEL1, SEL2 or SEL3 goes low or to a logic zero state, the corresponding addressable latch circuit chip is enabled and CPU data output on the line 112 passes into the selected latch and out of the output port designated by the three bit signal of the bus 106 when the latch select/clock signals SEL0-3 are brought low in response to the CPU clock signals applied from the line 110 to the decoder 36. As noted hereinbelow, data at the CPU CRUOUT output should be sampled by the external interface logic when the CRUCLK goes high. The CRUCLK high logic state is inverted and appears as a corresponding low state at the SEL0 through 3 signals, as described further in connection with the decoder 36.

The address decoder 36 includes a decoder circuit 154 provided by a type SN 74LS138, available from the aforementioned Texas Instruments Inc. The decoder circuit 154 has eight outputs, seven of which are used and include the chip select signals SEL4, SEL5 and SEL6 applied to the octal multiplexers 140, 142 and 144, as described hereinabove. The decoder circuit further includes two NAND circuits 155 and 156 receiving address bits A3, A4, A5 and A6 from the bus 105 as shown in FIG. 2A. The outputs of the NAND gates are applied to a NOR circuit 145 157 an output applied to the enable input of the decoder circuit 154. The address bits A7, A8, A9, A10 and A11 are applied to the circuit 154. Four of the outputs of the circuit 154 are applied to one input of the OR gates 158-1, 158-2, 158-3 and 158-4, respectively. An inverter is connected in series with the line 110 to apply the inverted CRUCLK signal to the second inputs of the OR gates 158-1 through 158-4. The decoder circuit 36 output associated with a latch circuit chip that is selected goes to the true low state so that the clock signals are applied by going to the low true state at the enable inputs of the latch circuits to properly clock the data from the CPU 26 as noted hereinabove. The addresses A3 through A6 which are decoded and applied to the enabling input of the decoder circuit 154 assure that the addresses beginning with 1E0, 1E2, and 1E3 must be present before the decoder circuit 154 is enabled since these are the most significant part of the system output addresses listed in Table II.

The output portion of the metering system 20 will now be described with regard to the inputs applied to the input interface 32. The A/D converter outputs include the data bits DB1 through DB8 being applied to the eight inputs of the octal multiplexer 140. The data bits DB9, DB10, and DB11 along with the twelfth converter output bit which is designated SIGN are applied to four of the inputs of the octal multiplexer 142. A/D data bits DB1 through DB11 and the SIGN are applied serially to the data input line 114 under control of the decoder 36 and addresses occurring on the address bus 106 to input the digitized signal values in binary representations.

The manual control 40 of FIG. 1 includes a display selector 159, a demand reset switch 160, a power error lamp reset switch 161, and a master reset switch 162. The display selector 159 is a six position switch having a movable switch arm connecting the switch output terminals with the system ground. One of the calculated parameters of the electric energy quantity is displayed at the readout display 42 by positioning the switch arm of the switch selector 159. The output terminals of the selector 159 are designated KWH for displaying kilowatt-hours, KWD for displaying kilowatt demand, QH for displaying Q-hours and V²H for displaying volts-squared-hours and TEST to display a test output at the readout display 42. Accordingly, the logic control signals $\overline{DKWH}$, $\overline{DDEM}$, $\overline{DQHR}$, $\overline{DBSQ}$ and $\overline{DTST}$ are applied from the corresponding switch outputs to six of the inputs of the octal multiplexer 144. The aforementioned display selector logic control signals have a true low logic state to signal the system the desired parameter value which is to be displayed at the readout display 42.

The switches 160, 161 and 162 are a single throw, single pole or pushbutton type having one terminal of each connected to the system ground as indicated in the FIG. 2A. The demand reset switch 160 effects an $\overline{REDEM}$ signal to an input of the multiplexer 140 to reset the demand metering period of the metering system 20. This occurs generally at the end of a regular billing period such as once each month, corresponds to resetting to zero the maximum indicating pointer of an electrical mechanical demand meter. The switch 161 is effective to apply the control logic signal $\overline{RBEA}$ having a true low signal when the switch is closed to reset the power fail error lamp 163 described further hereinbelow. Finally, the master reset switch 162 produces a $\overline{RESET}$ to the multiplexer 142 when the switch is closed. The true low state of the $\overline{RESET}$ signal as effective as to reset the entire metering system 20 to zero including resetting of the addressable latches in the output interface 34 as described hereinabove.

The eighth input to the octal multiplexer 144 includes the TIMR signal on line 117 from the sample timer circuit 46 described hereinabove. The status output of the A/D converter 38 provides a STAT status input signal to the octal multiplexer 142. The logic one state of the STAT signal indicates data conversion is not complete and the transision to the logic zero state indicates that the data conversion has been completed and is ready for the A/D data outputs to be processed into the system. The DINT signal is developed in the pulse receiver 58 formed by a tape recorder as shown in FIG. 2A. The demand interval pulse DINT has a low true logic state and is applied at regular demand intervals such as for example every 15 minutes. Finally, the multiplexer 142 receives the PWRF power failure control signal generated in the power supply 50 as described hereinbelow. A low true state of the PWRF signal indicates that the power supply input power at terminals 52 has been lost.

The output portion of the system 20 is now described initially referring to the system output ports formed by the outputs of the four latches 146, 148, 150 and 152 included in the output interface 34. The system output signals are listed in Table II and are generally included in the three output functions. The output functions include servicing of the eight digit numerical readouts of the readout display 42 and the display lights of the indicators section 62, and outputting the output signals corresponding to the measured parameters calculated by the system as well as a test-pulse signal output, and finally providing the system control signals produced in the sequence controller and calculator subsystem 24. Seven outputs of the latch 146 produce the digit segment select signals DSA, DSB, DSC, DSD, DSE, DSF, and DSG through drivers 165 to the numerical readout display 42. The eight digits of display are each formed by seven segment light elements provided in the numerical readout display 42 which comprises two type DL34M display units available from Litronix, Inc. The seven segments of each of the eight digits of the display are turned on by a logic zero state of the display segment select signals DSA-DSG. The eight outputs of the latch 148 provide the digit select signals DS1, DS2, DS3, DS4, DS5, DS6, DS7 and DS8 which are applied to circuit drivers 166 to the digit select inputs of the readout display 42.

The indicator section 62 includes the aforementioned power fail error status light 163 and a test pulse light 168 and both are formed by light emitting diodes (LEDs) having the anodes connected to a source of positive voltage as indicated. A TLED control signal from the eighth output of the latch 146 activates the light 168 through the circuit drivers 169 when the TLED has a logic one state. The logic signal BCF from the latch 150 activates the power fail error light 163 through the circuit drivers 169 when the BCF signal has a logic one state. The light 163 indicates the status that the system sensed a loss of memory in RAM 28, such loss being assumed to be caused by loss of battery carryover power applied from the power supply 50 and that the memory storage in the RAM 28 needed to be reloaded from PROM 27.

The system output measuring information signals are developed by the KWHP, QHRP and VSQP signals produced from the latch 150 and through circuit drivers 170 having outputs connected to the KWH, the QHR and V²H output signal terminals shown in FIG. 2A. The output terminals produce corresponding kilowatt-hour, Q-hours and volts-squared hours with the pulses having transitions between opposite voltage polarities so that the recording pulse currents pass in opposite directions through the recording heads H1, H2 and H3 of recorder type pulse receiver 58 connected to the aforementioned three output signal terminals. The magnetic recording heads provided in a magnetic recorder type pulse receiver 58 can be as disclosed in U.S. Pat. Nos. 3,943,498, issued Mar. 9, 1976; 2,470,470, issued Sept. 30, 1969; 3,538,406, issued Nov. 3, 1970; 3,913,129 and 3,913,130, both issued Oct. 14, 1975, and assigned to the assignee of this invention. As described in the aforementioned patents, a demand interval recording head, such as recording head H4 is provided in this type of recorder and is energized from a source of interval pulses 44 which may include regularly time spaced contact closures defining demand intervals which occur, for example, at 15 minute intervals as noted hereinabove. Besides energizing the recording head H4, the source of interval pulses produces the DINT logic signal having a low true logic state, such as occurs for example with each of the aforementioned contact closures developing the demand interval pulses in the recorder type pulse receiver 58. Pulses are recorded on the recording tape medium 174 as described in the aforementioned patents. A test-pulse output jack 60 shown in FIG. 2A produces test-pulses in response to a TSTP signal from the output of latch 150. The test-pulse output is monitored for checking and calibration of the metering system 20.

Referring now to the remaining system output signals, the RINT signal is produced from the latch 150 and is applied to the line 133 which is connected to the NOR gate 131 in the sample timer circuit 46 and the signal RINT has a logic one or high true reset state to reset the sample timer counter arrangement following a TIMR signal. A STOP signal is produced from an output of the latch 150 and drivers 169 and is applied to the power supply 50 to initiate a $\overline{\text{SYSINT}}$ to reset the CPU 26, as described further hereinbelow in connection with the description of the power supply 50.

The output interface latch 152 produces the SCON signal to the A/D converter 38 to start the data conversion process therein. The MUX ADR address bits ADR0, ADR1 and ADR2 of the MUX ADR bus are also provided at three outputs of the latch 152. The ZCONT is applied from latch 152 to the input current analog multiplexer 73. The logic one state of ZCONT allows the current input signals $I_A$, $I_B$ and $I_C$ to pass through to the sample and hold circuits 69, 70 and 71. The logic zero state of ZCONT grounds the current inputs to the sample and hold circuits 69, 70 and 71. The HOLD signal from latch 152 is applied simultaneously to the six sample and hold circuits 66, 67, 68, 69, 70 and 71 to effect a sampling signal with the logic one of the signal forming the hold operation and the logic zero state allowing the sample and hold circuits to track or cause the analog outputs to follow the analog inputs directly.

Description of the Power Supply 50 and FIGS. 3A and 3B

Referring now to the power supply 50 generally shown in FIG. 1 wherein is shown the +5 VDC and ±15 VDC outputs that are generated using standard diode bridges and solid state regulators connected to the primary input 52 receiving the 120 VAC 60 Hz. primary power. Heavy filtering using conventional techniques, including capacitors provides for sufficient energy storage to provide a limit of between 30 to 50 milliseconds of carryover output power in case of a momentary primary power interruption at the input 52. Upon sustained loss of the primary power, the battery 54 is capable of furnishing the +5 VDC output which is used exclusively to supply the RAM section 28 and retain the memory storage therein during a power outage. Battery carryover circuit arrangements suitable for use in the power supply 50 are disclosed in the above-identified U.S. patents relating to a description of the magnetic recorder type pulse receiver 58.

In FIGS. 3A and 3B, two power supply status monitoring circuits are illustrated in the electrical schematic circuit diagrams therein. In FIG. 3A, operational amplifier comparators 180 and 181 are provided, each forming on-half of a type SN 747. The three DC output voltages of the power supply 50 are summed and applied at both inverting inputs 182 and 183 of the OP AMPs and the outputs of the OP AMPs are applied through resistors 184 and 185 to the base biasing circuits of an NPN transistor 186 and a PNP transistor 187, respectively. The emitter-collector circuits of the transistors are connected in series with an LED forming the indicator light 53 also shown in FIG. 1. The +5 output voltage is applied across a resistance voltage divider including the series resistors 188 and 189. A second resistance voltage divider including series resistors 198 and 199 is connected across the +15 and −15 voltages. The commonly connected junctions of the voltage dividers produce a 3 volt reference voltage when the output voltages are properly regulated. +15 volts is applied across a resistance voltage divider including resistors 191, 192 and 193, the junction of the resistors 191 and 192 developing a +4 volt reference voltage at the non-inverting input 194 of the OP AMP 180. The junction between the resistors 192 and 193 applies a +2 volt reference voltage at the non-inverting input 195 of the OP AMP 181. The +3 reference voltage at the junction of the resistors 188 and 189 is applied through the equal valued resistors 196 and 197 and to the inverting inputs 182 and 183, respectively. The transistors 186 and 187 are held in a conductive state so long as the proper regulated DC voltage is being supplied from the power supply 50 so that the +3 reference voltage does not vary beyond the +2 and +4 comparator voltages. The indicator light 53 is illuminated while both transistors 186 and 187 are conducting.

FIG. 3B shows the power supply monitoring circuit for monitoring the loss of the 120 VAC primary power to the power supply. The inputs 200 are connected to the 120 VAC input and the input voltage is rectified and conditioned by the diodes 201 and 202 and series resistor 203. The rectifier circuit is connected to an optical coupler of a type MCT-2 available from Monsanto Corporation and including an LED connected to the input half wave rectifier circuit. A photoresponsive transistor provides the output of the optical coupler 205 which is applied across a capacitor 206 connected in series with a resistor 207 and to a +5 volt reference. Resistor 207 charges capacitor 206 from the +5V source during the half cycle when the coupler 205 is not conducting. The capacitor 206 discharges through the coupler phototransistor when it is conducting during the other half cycle of the primary power. The capacitor voltage is applied through resistor 208 to an OP AMP comparator 209, being of a type SN 741. The resistor 208 is connected to the inverting input of the OP AMP comparator 209 and a +3 voltage source, available at the +3 volt reference in FIG. 3A, is connected to a resistor 210 to the non-inverting input. The OP AMP circuit 209 is connected as shown including the resistor 211 and diode 212 connected between the output and the non-inverting input provides a comparator circuit operation. Rectified half cycles of 60 Hz. are applied to the optical coupler 205 and the charging and discharging voltages on the capacitor 206 remain below the +3 volt reference. When the primary 120 VAC is stopped or is interrupted, the voltage on the capacitor 206 will rise above the +3 value in approximately 20 milliseconds after the last half wave through the coupler 205. This causes the comparator 209 output to switch to a value below the logic ground or zero by the amount of the voltage drop across the diode 212.

The output of the OP AMP comparator 209 produces the PWRF signal and the output is also applied to one input of a gate 214. A second input to the gate 214 is the STOP signal from the output interface 34. The PWRF logic signal from the comparator 209 is applied to the input interface 32. The PWRF signal has a low true value occurring when the primary 120 VAC interruption occurs beyond 20 milliseconds. The system 20 senses the presence of the PWRF signal and in turn initiates the STOP signal at the interface 34 which has a high true value, as noted hereinabove. The low true logic zero state of PWRF and high true logic one state of STOP produce a gate 214 output having a low true logic state, producing the $\overline{\text{SYSINT}}$ signal which is applied to the D input of the clock source 30. This in turn initiates the $\overline{\text{RESTART}}$ signal to reset the CPU 26. The momentary carryover feature of at least 30 to 50 milliseconds due to the high output filtering of the power supply 50 assures that the CPU 26 has time to initiate its reset before the momentary power carryover is lost to the system 20 from the power supply 50. If primary power returns before the momentary power carryover expires, the $\overline{\text{SYSINT}}$ goes high to a logic one state and the $\overline{\text{RESTART}}$ is released so that the CPU 26 can return to operation. In brief summary, a primary power outage produces the PWRF signal to initiate the STOP signal and in turn the $\overline{\text{SYSINT}}$ and $\overline{\text{RESTART}}$ signals and bring the CPU 26 to the known reset condition which is followed by an IDLE routine. This enables a restart of the CPU 26 to go through its internally programmed initializing process and restart in synchronized operation. If power to the CPU 26 is lost without returning to the CPU reset condition, the system would not be able to start after a power outage since the routine sequence would be interrupted and out of order.

Description of the System Programmed Operation shown in FIGS. 5 through 12

The system 20 is operated in a predetermined programmed sequence of operation for measuring parameters of an electric energy quantity supplied or consumed in a polyphase power line network. The system performs asynchronous or randomized instantaneous sampling of the voltage and current signal components of the polyphase electric energy quantity, performs sequential digitizing of the instantaneous sampled values, performs real-time calculation of the desired parameters of the electric energy quantity including kilowatt-hours, kilowatt demand, Q-hours and the volts-squared-hours, produces output pulse data signals representing the calculated parameters, continuously updates accumulated values in a BCD binary code format of the calculated parameters for visual numerical display of the real time values, and monitors the sequence of the system operation and protects the system from erroneous operations in the event of loss of the system power supply. Since the sequence controller and calculator subsystem 24 is a microcomputer or microprocessor based subsystem, a programmed sequence of instructions is required for its operation. The aforementioned Texas Instruments Inc. publications directed to the TMS 9900M microprocessor are to be referred to for detailed explanations of the basic operating characteristics and program instructions for the internal microprocessor operation. The subsystem 24 has a configuration generally corresponding to the TMS 9900 system described in the aforementioned Application Report Bulletin CA-184, except for the details of the subsystem 24, described hereinabove.

The program of instructions for the system operation is permanently stored in the PROM 27. The known and prescribed instructions for the microprocessor based subsystem 24 are stored in the PROM 27 in accordance with the manufacturer's directions and instructions. The sequence of operation and program described herein is directed to the specific operations of the system 20 of this invention for purposes of simplifying this description and because detailed information is available, as noted hereinabove, for the microprocessor. While the PROM 27 is permanently programmed, the RAM 28 provides temporary read/write storage for 38 system constants which are permanently stored in the PROM, for other data and for scratch pad and workspace use. The PROM and RAM memory contents and locations are described in further detail hereinbelow in connection with the flow diagrams of the system program.

Generally, in the subsystem 24 a computer word is considered as a 16 bit field and a byte is considered as eight bits. The first two words of PROM stored instruction includes reset vectors and the remainder of the 1,024 locations of PROM 27 are allocated to data storage between designated addresses 004H and 096H (hexadecimal) and program storage begins at a designated address 098H(hex). The RAM memory locations are between designated addresses 0800 and 9FEH(hex) as described further hereinbelow. The Tables I and II hereinabove include the CPU address for each of the system input and output signals and the signal name or mnemonic which is also used in the flow diagrams described hereinbelow.

Figure 5:
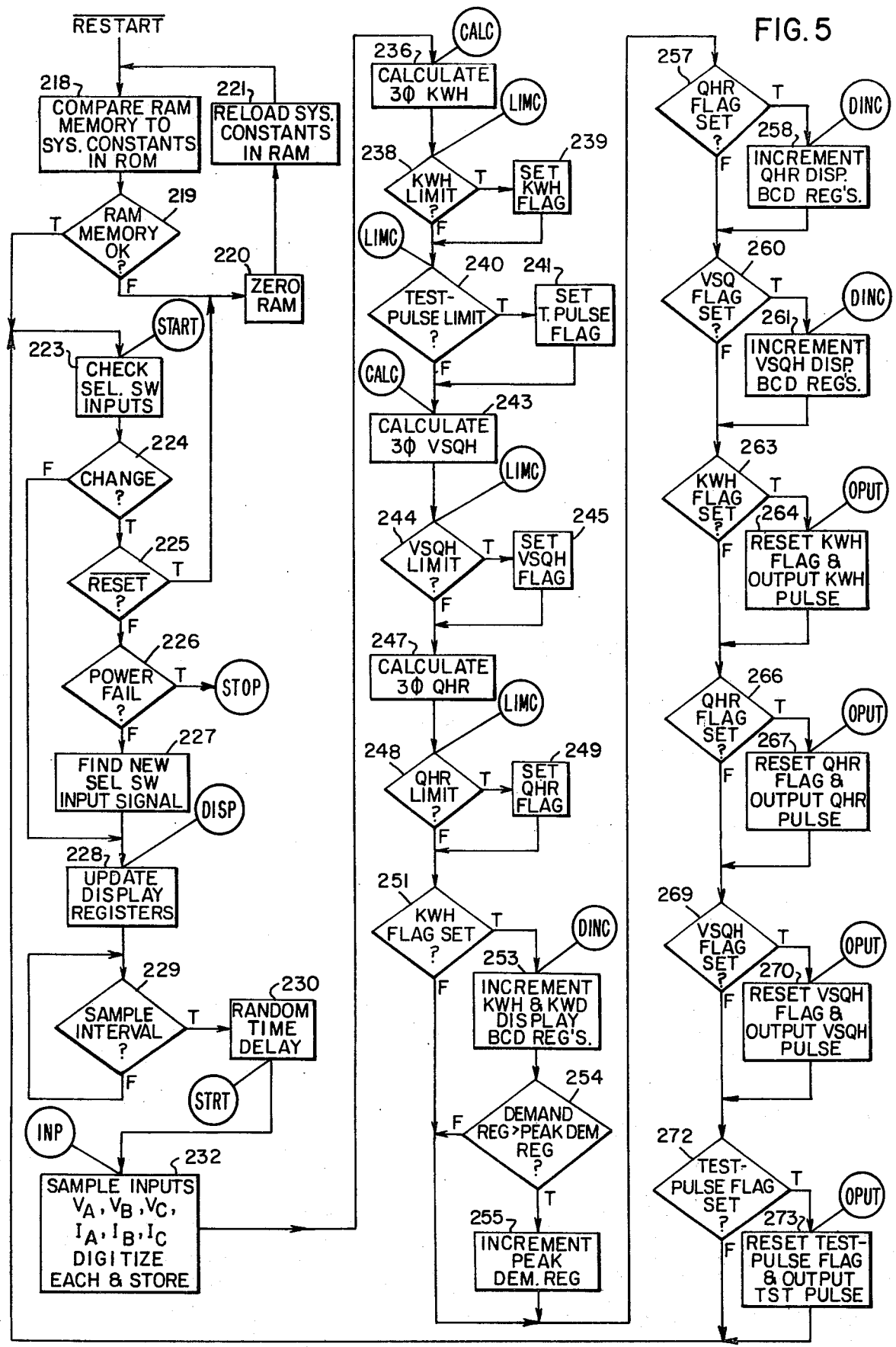
FIG. 5 illustrates a master flow diagram of a general system program, including an initializing memory check routine, for controlling the sequence of operation of the system shown in FIGS. 2A and 2B.

Referring now to FIG. 5, there is shown the master flow diagram for effecting the sequence or steps of operation of the metering system 20. The routines and subroutines included in FIG. 5 are described in detail hereinbelow and are indicated in circles having the instruction labels at the point in the master flow diagram where they are to be called for. The initial operation of the TMS 9900 microprocessor CPU 26 is in accordance with the prescribed instructions. The $\overline{\text{RESTART}}$ initiates the power-on reset described in the aforementioned Texas Instruments publications. The system program begins its initialization which is a memory check routine and compares the RAM memory contents to the system constants which are permanently stored in PROM 27. The system constants are noted by an asterisk (*) in the RAM Registers Memory Map listed in Table III hereinbelow. The comparison of the RAM memory at its locations for the system constants is made at locations in PROM having the permanently stored constants and is designated as step 218 in FIG. 5. This begins the memory check routine of the program. The decision step 219 establishes if the RAM memory properly includes the system constants. If it does not, the RAM memory is reset to zero at step 220 and in step 221 the system constants are reloaded into RAM from PROM 27. A memory check is again performed and if the RAM memory is proper, the program begins the START routine.

The step 223 of the START routine loads the system input switch input signals from the display selector 159 to check if the selected parameter to be displayed at the readout display 42 has been changed by changing the position of the display selector. If the decision step 224 is true, it is determined that the display selector switch inputs have changed from the previous start routine and a further check is made at the decision point 225 to determine if a $\overline{\text{RESET}}$ signal is present and if true, the routine returns to the step 220 to reload the system constants in the RAM. If the decisions at steps 224 and 225 are false, a decision step 226 determines if there has been a failure in the primary supply of the power supply which produces the PWRF signal. If step 226 is true, the system is brought to the stop condition and an IDLE instruction is executed in anticipation of the system power supply going out of regulation. If the step 226 is false, the step 227 checks to determine the new selector switch input signal. Upon determining the new switch input signal or if at step 224 there has been no change in the switch input signal, the program begins the DISP display routine to provide the numerical readout at the display 42 in accordance with the display selector position.

At step 228, the display registers are updated in the DISP routine and the corresponding seven segment select and digit select signals are applied to the readout display 42. The program then waits for a sample interval timer pulse TIMR indicating the beginning of a sample interval as initiated in the sample timer 46, described hereinabove. Accordingly, at the decision step 229, a false causes the system to wait for a new TIMR signal to begin and when it begins, a random time delay is produced at step 230 so as to produce the randomized or asynchronous sampling of the analog input signals in accordance with an important feature of this invention.

The end of the random time delay is indicated by the STRT label in the program that is followed by an INP, A/D converter input subroutine. At step 232 the three phase voltages and currents are sampled and sequentially applied to the A/D converter 38 where each of the instantaneously sampled values are converted to sign and magnitude data bits which are applied to the subsystem 24 for calculation of the parameters to be measured.

Accordingly, the program reaches a CALC calculation subroutine. At step 236 the three phase kilowatt-hours parameter is computed and the time integral values are compared to predetermined limits in an LIMC limit comparison subroutine so that when the limits are exceeded, the pulse data output signal circuits can be made to change their output state, thus generating metering output signals. At step 238, the kilowatt-hour (KWH) limit is compared to the accumulated calculated value and if true, a KWH flag signal is set at step 239. After the KWH flag is set or if the KWH limit has not been reached, a decision step 240 is reached where the test-pulse limit is compared to the accumulated value for the test pulse and if the limit has been exceeded, the step 241 sets the test-pulse flag. This permits known voltage and current signal values having a known kilowatt power value to be applied to the analog input 22 and test-pulse outputs will indicate the calibrated kilowatt-hour pulse values of the system. The program returns to the CALC subroutine where the volt-squared-hours parameter (VSQH) is calculated at step 243. The program decision step 244 tests the VSQH limit to determine whether a flag is to be set at the step 245.

The calculation subroutine continues by calculating the three phase Q-hours at step 247 and the decision step 248 determines whether the QHR limit has been reached and whether or not to set the QHR flag at step 249.

The program then tests the flag registers to determine which of the flags have been set during the CALC calculation routine noted hereinabove. At decision step 251, the KWH flag is tested and if it has been set, the step 253 causes the kilowatt-hour and kilowatt demand display binary coded digit registers to be incremented. At a true state of the step 251, the DINC display register increment subroutine is executed. Following the step 253, the decision step 254 determines whether the demand register is greater than the peak demand register and if true, at step 255, the peak demand BCD register contents are replaced with the demand register contents. Correspondingly, at decision step 257, the QHR flag set is tested to determine whether or not the QHR display BCD registers are to be incremented at step 258. The decision step at 260 tests whether the VSQ flag has been set and determines whether to increment, at step 261, the VSQH display BCD registers.

The program is then at a point to perform the OPUT output pulse subroutine which tests the KWH flag set at decision step 263; the QHR flag set, at decision step 266; the VSQH flag set, at decision step 269; and the test-pulse flag set at decision step 272. At each of these decision steps, beginning with the step 263, if the flag set is true, the corresponding flag is reset and an output pulse is initiated. Accordingly, at step 264, the KWH flag is reset and a KWH pulse is initiated, at step 267 the QHR flag is reset and a QHR pulse is initiated, at step 270 the VSQH flag is reset and a VSQH pulse is initiated, and at step 273 the test-pulse flag is reset and the TST pulse is initiated. Upon reaching the steps 272 or 273, the program then returns to the START routine at step 223 to repeat the program operation.

The routine and subroutine labels of the master program of FIG. 5 are now described in connection with the description of the FIGS. 6, 7, 8, 9, 10, 11 and 12 showing the respective flow diagrams.

Tables III and IV are set forth immediately hereinbelow in which Table III includes the RAM Registers Memory Map showing the details of the workspace registers associated with the flow diagrams shown in FIGS. 6 through 12. The Table IV identifies the sixteen bit locations in the flag and status registers referred to in the program description. Also, the addresses of the system inputs and outputs as listed in Tables I and II are also referred to in the description of the flow diagrams of FIGS. 6 through 12.

TABLE III

| | | RAM Registers Memory Map | |
|---|---|---|---|
| ADR | REG | DISPLAY CONTROL WORKSPACE Data | Description |

TABLE III-continued
RAM Registers Memory Map

| ADR | REG | Data | Description |
|---|---|---|---|
| 800 | R0 | | |
| 808 | R4 | | |
| 80A | R5 | 1E20* | CRU Base ADR for Dig. Sel. |
| 80C | R6 | 1E10* | CRU Base ADR Seg. Drives |
| 80E | R7 | | Offset Registry |
| 810 | R8 | | |
| 812 | R9 | 0970* | 7 Seg. Code Base ADR |
| 814 | R10 | | Dig. Sel. Mask |
| 816 | R11 | | Disp. Dig. Reg Base ADR |
| 818 | R12 | 1E10 | CRU Base ADR |
| ↓ | ↓ | | |
| 81E | R15 | | |

I/O CONTROL WORKSPACE

| ADR | REG | Data | Description |
|---|---|---|---|
| 820 | R0 | | Analog MUX ADR Storage |
| 822 | R1 | | Data Store ADR/Output Flag Mask |
| 824 | R2 | | Last Value Output Mask |
| 826 | R3 | | |
| ↓ | ↓ | | |
| 832 | R9 | | |
| 834 | R10 | | Output Flag Reg |
| 836 | R11 | | Subroutine Link ADR |
| 838 | R12 | 1E30* | Output CRU Base ADR |
| ↓ | ↓ | | |
| 83E | R15 | | |

CALCULATION WORKSPACE

| ADR | REG | Data | Description |
|---|---|---|---|
| 840 | R0 | | Multiplicand 1/Product (MSW) |
| 842 | R1 | | Product (LSW) |
| 844 | R2 | | Multiplier 1 |
| 846 | R3 | | Multiplicand 2/Product (MSW) |
| 848 | R4 | | Product (LSW) |
| 84A | R5 | | Multiplier 2 |
| 84C | R6 | | Multiplicand 3/Product (MSW) |
| 84E | R7 | | Product (LSW) |
| 850 | R8 | | Multiplier 3 |
| 852 | R9 | | Temporary Accumulator (MSW) |
| 854 | R10 | | Temporary Accumulator (LSW) |
| 856 | R11 | | Subroutine Link ADR |
| ↓ | ↓ | | |
| 85E | R15 | | |

DATA INPUT CONDITIONING WORKSPACE

| ADR | REG | Data | Description |
|---|---|---|---|
| 860 | R0 | | $V_A$ |
| 862 | R1 | | $V_B$ |
| 864 | R2 | | $V_C$ |
| 866 | R3 | | $I_A$ |
| 868 | R4 | | $I_B$ |
| 86A | R5 | | $I_C$ |
| 86C | R6 | | $V_A$ Sign Flag one |
| 86E | R7 | | $V_B$ Sign Flag two |
| 870 | R8 | | $V_C$ Sign Flag three |
| 872 | R9 | | $I_A$ Sign Flag four |
| 874 | R10 | | $I_B$ Sign Flag five |
| 876 | R11 | | $I_C$ Sign Flag six/MUX ADR |
| 878 | R12 | 1E40* | Input Base ADR A/D |
| 87A | R13 | | Data Storage |
| 87C | R14 | | |
| 87E | R15 | | |

DISPLAY REGISTER BCD INCREMENT WORKSPACE

| ADR | REG | Data | Description |
|---|---|---|---|
| 880 | R0 | | Digit Base ADR |
| 882 | R1 | | Digit Count |
| 884 | R2 | 0009* | |
| 886 | R3 | 000A* | |
| 888 | R4 | 0001* | |
| 88A | R5 | | Demand Reg. ADR |
| 88C | R6 | | Peak Demand Reg. ADR |
| 88E | R7 | | Pass Count |
| 890 | R8 | 093E* | Demand Reg. Base ADR |
| 892 | R9 | 094E* | Peak Demand Reg. Base ADR |
| 894 | R10 | 0008* | Pass Count Limit |
| 896 | R11 | | Subroutine Link ADR |
| ↓ | ↓ | | |
| 89E | R15 | | |

LIMIT COMPARISON WORKSPACE

| ADR | REG | Data | Description |
|---|---|---|---|
| 8A0 | R0 | | ΔIncrement From Calc. |
| 8A2 | R1 | | Accumulator (MSW) |
| 8A4 | R2 | | Accumulator (LSW) |
| 8A6 | R3 | | Limit (MSW) |
| 8A8 | R4 | | Limit (LSW) |
| 8AA | R5 | | Variable Accumulator ADR |
| 8AC | R6 | | |
| 8AE | R7 | 003C* | KWH Limit (MSW) |
| 8B0 | R8 | E637* | KWH Limit (LSW) |
| 8B2 | R9 | 00B6* | Test Pulse Limit (MSW) |
| 8B4 | R10 | B2A5* | Test Pulse Limit (LSW) |
| 8B6 | R11 | | Subroutine Link ADR |
| 8B8 | R12 | 001E* | QHR Limit (MSW) |
| 8BA | R13 | 73D7* | QHR Limit (LSW) |
| 8BC | R14 | 001D* | VSQH Limit (MSW) |
| 8BE | R15 | FD4A* | VSQH Limit (LSW) |

VARIABLE ACCUMULATOR REGISTERS

| ADR | REG | Description |
|---|---|---|
| 8C0 | R0 | KWH Accumulator (MSW) |
| 8C2 | R1 | KWH Accumulator (LSW) |
| 8C4 | R2 | Test Pulse Accumulator (MSW) |
| 8C6 | R3 | Test Pulse Accumulator (LSW) |
| 8C8 | R4 | QHR Accumulator (MSW) |
| 8CA | R5 | QHR Accumulator (LSW) |
| 8CC | R6 | VSH Accumulator (MSW) |
| ↓ | ↓ | |
| 8DE | R15 | VSQH Accumulator (LSW) |

SWITCH INPUT WORKSPACE

| ADR | REG | Data | Description |
|---|---|---|---|
| 8E0 | R0 | | SW Input Reg. |
| 8E2 | R1 | | SW Input Status |
| 8E4 | R2 | 0001* | Mask 0 |
| 8E6 | R3 | 0002* | Mask 1 |
| 8E8 | R4 | 0004* | Mask 2 |
| 8EA | R5 | 0008* | Mask 3 |
| 8EC | R6 | 0010* | Mask 4 |
| 8EE | R7 | 0020* | Mask 5 |
| 8F0 | R8 | 0040* | Mask 6 |
| 8F2 | R9 | 0080* | Mask 7 |
| 8F4 | R10 | 0100* | Mask 8 |
| 8F6 | R11 | 0200* | Mask 9 |
| 8F8 | R12 | 1E5A* | SW Input CRU Base ADR |
| 8FA | R13 | | Demand Int. Flag |
| 8FC | R14 | 0816* | ADR 816 |
| 8FE | R15 | | Disp. Reg. Base ADR |

BCD KWH and VSQ DISPLAY ACCUMULATOR REGISTERS

| ADR | Description |
|---|---|
| 900 | KWH Digit 1 |
| 902 | KWH Digit 2 |
| 904 | KWH Digit 3 |
| 906 | KWH Digit 4 |
| 908 | KWH Digit 5 |
| 90A | KWH Digit 6 |
| 90C | KWH Digit 7 |
| 90E | KWH Digit 8 |
| 910 | VSQ Digit 1 |
| 912 | VSQ Digit 2 |
| 914 | VSQ Digit 3 |
| 916 | VSQ Digit 4 |
| 918 | VSQ Digit 5 |
| 91A | VSQ Digit 6 |
| 91C | VSQ Digit 7 |
| 91E | VSQ Digit 8 |

BCD QHR and DEMAND DISPLAY ACCUMULATOR REGISTERS

| ADR | REG | Description |
|---|---|---|
| 920 | R0 | QHR Digit 1 |
| 922 | R1 | QHR Digit 2 |
| 924 | R2 | QHR Digit 3 |
| 926 | R3 | QHR Digit 4 |
| 928 | R4 | QHR Digit 5 |
| 92A | R5 | QHR Digit 6 |
| 92C | R6 | QHR Digit 7 |
| 92E | R7 | QHR Digit 8 |
| 930 | R8 | Demand Digit 1 |
| 932 | R9 | Demand Digit 2 |
| 934 | R10 | Demand Digit 3 |
| 936 | R11 | Demand Digit 4 |
| 938 | R12 | Demand Digit 5 |
| 93A | R13 | Demand Digit 6 |
| 93C | R14 | Demand Digit 7 |
| 93E | R15 | Demand Digit 8 |

BCD PEAK DEMAND and DISP. OFF DISPLAY ACCUMULATOR REGISTERS

| ADR | REG | Description |
|---|---|---|
| 940 | R0 | Peak Demand Digit 1 |
| 942 | R1 | Peak Demand Digit 2 |
| 944 | R2 | Peak Demand Digit 3 |
| 946 | R3 | Peak Demand Digit 4 |
| 948 | R4 | Peak Demand Digit 5 |
| 94A | R5 | Peak Demand Digit 6 |
| 94C | R6 | Peak Demand Digit 7 |
| 94E | R7 | Peak Demand Digit 8 |
| 950 | R8 | Display Off Digit 1 |
| 952 | R9 | Display Off Digit 2 |

TABLE III-continued
RAM Registers Memory Map

| | | |
|---|---|---|
| 954 | R10 | Display Off Digit 3 |
| 956 | R11 | Display Off Digit 4 |
| 958 | R12 | Display Off Digit 5 |
| 95A | R13 | Display Off Digit 6 |
| 95C | R14 | Display Off Digit 7 |
| 95E | R15 | Display Off Digit 8 |

DISPLAY TEST and 7 SEGMENT REGISTERS

| ADR | REG | Data | Description |
|---|---|---|---|
| 960 | R0 | | Test Digit 1 |
| 962 | R1 | | Test Digit 2 |
| 964 | R2 | | Test Digit 3 |
| 966 | R3 | | Test Digit 4 |
| 968 | R4 | | Test Digit 5 |
| 96A | R5 | | Test Digit 6 |
| 96C | R6 | | Test Digit 7 |
| 96E | R7 | | Test Digit 8 |
| 970 | R8 | 4079* | 7 Seg. Code (0,1) |
| | R9 | 2430* | 7 Seg. Code (2,3) |
| | R10 | 1917* | 7 Seg. Code (4,5) |
| | R11 | 0378* | 7 Seg. Code (6,7) |
| | R12 | 0018* | 7 Seg. Code (8,9) |
| 97A | R13 | 7F00* | Digit Off Code |
| 97C | R14 | | |
| 97E | R15 | | |

TABLE IV
FLAG and STATUS REGISTER BIT ALLOCATIONS

| | Register Addresses | | |
|---|---|---|---|
| Bit Locations | 8E2(R1) Sw. Input Status Reg. | 8FA(R13) Demand Interval Flag Reg. | 834(R10) Output Flag. Reg. |
| (Flag) | | | |
| D0 | PWRF | DINT Flag | Test TIMR |
| D1 | DINT | | KWHOP |
| D2 | RESET | | QHROP |
| D3 | DTEST | | VSQOP |
| D4 | DVSQ | | Batt. Fail Light |
| D5 | DQHR | | |
| D6 | DDEM | | |
| D7 | RDEM | | TSPOF |
| (Status) | | | |
| D8 | TIMR | | 0 |
| D9 | DKWH | | KWHOP |
| D10 | RBEA | | QHROP |
| D11 | | | VSQOP |
| D12 | | | Batt. Fail Light |
| D13 | | | 0 |
| D14 | | | |
| D15 | | | TSTOP |

Description of the routine and subroutine flow diagrams shown in FIGS. 6 through 12 is made with reference to the master routine shown in FIG. 5 and Tables I-IV. As noted hereinabove, the program begins with the RESTART signal effective to produce the power-on restart in the microprocessor CPU 26. Initialization of the system program includes the memory check performed at step 218 in FIG. 5. The data indicated with an asterisk (*) in Table III includes the system constants which are permanently stored in the PROM. During the memory check routine, the corresponding RAM and PROM addresses are checked and data comparison occurs to determine if the RAM data matches that which is programmed in the PROM. As noted hereinabove, there are thirty-eight system constants included in the register descriptions of Table III. Upon determining that the RAM has been loaded with the system constants, the program is ready to begin the START routine illustrated in the flow chart diagram of FIG. 6. The switch inputs are read in step 223 to determine which of the control signals DTST, DVSQ, DQHR, DDEM and DKWH indicates that the associated register is to be displayed at the readout display 42, except in the case of the display test signal DTST described further hereinbelow. The start routine of FIG. 6 utilizes the switch input workspace including addresses 8E0 through 8FE (hex). The display switch input logic signals are read into register space R0 and the present state of the switches is compared to the last reading, stored in register R1, as indicated at the decision step 224, and if there is no change, the program branches to the instruction routine label DISP. If there is a change, the program begins to search for the active input. The master reset switch is tested to determine if the RESET signal is present as indicated by the decision step 225, as noted hereinabove. The power off PWRF signal is next tested at the decision step 226 and if true, the sample timer circuit 46 is reset to prevent a restart of the timer circuit and then an IDLE instruction is executed to stop the microprocessor CPU. If the power indication is proper, then the demand interval contact from the demand interval pulse source 44 producing the DINT signal is tested at the decision step 270. If the demand interval pulse is being produced, such as by the closure of contacts in the pulse source 44, the DINT flag is tested at decision step 271 with the DINT flag being present in register R13. If the flag is not set, this will occur at the first time the demand pulse contacts have been found closed and the DINT flag is set at step 272 and the demand register addresses 930 through 93E in the BCD demand display accumulators, as indicated by the step 273. If the DINT signal indicates the demand pulse contacts are not closed, then the DINT flag is reset as indicated at step 275 and the program continues. The demand reset switch input is checked at decision step 276 to determine if a new demand billing period is to be started. If the decision is true, the BCD peak demand registers are cleared at addresses 940 through 94E in step 277. The execution continues by testing the RBEA battery carrier over error reset switch at decision step 279 and if true, the output interface port at address 1E38 which drives the indicator light 163, is set to zero, as indicated at step 280.

At this point in FIG. 6, the subsystem 24 tests which position the display selector switch 159 is in and loads the base address of the desired register into Reg. R15 through the address continued in R14 which is the display base address register R11 at address 816 in the display control workspace. Accordingly, if one of the decision steps 282, 283, 284, 285 and 286 is true, then the base address is correspondingly set to one of the addresses 960, 910, 920, 940 or 900, respectively at one of the steps 287, 288, 289, 290, 291, respectively. If the outputs of the steps 282 through 286 are false the routine goes to step 292 where the instruction sets base address to 950 since none of the positions of the display selector have been selected and the program goes to the display off registers at address 950. The routine is ready then to branch to the DISP subroutine.

FIG. 7 shows the DISP display subroutine which is associated with the display control workspace beginning at address 800. First, the contents of the offset Reg. R7 are incremented by two and then compared to 10 (hex) as indicated in steps 295 and 296 to start the BCD to seven segment code conversion. If the step 296 is true, this means that all digits have been displayed and Reg. R7 is cleared at step 297 so as to point back to the first digit in the selected register. The address of the digit to be displayed is computed by adding the display digit base address in Reg. R11 to Reg. R7 which may have been determined during the previous switch input test routine. For example, if the kilowatt-hours is to be displayed, the address 900 would be in Reg. R7. This occurs in step 298. The contents of this address are then moved to Reg. R1 in the display control workspace. Since the BCD display accumulator registers are incremented as single BCD digits per word, the address where the seven segment code for the digit to be displayed may be computed simply by adding the contents of the Reg. R1 (which is the digit base address plus the BCD register) to the seven segment code base address contained in Reg. R9 are provided at step 300. At step 301, the addressed byte is then moved into Reg. R0 and the output starts at location 1E20. At step 302, the digit select mask, which consists of two bytes in Reg. R10 and composed of a pattern of the single one and seven zeroes in the first byte and repeated in the second byte, is shifted right circular and then outputted at the address 1E10 to turn on the correct driver at step 303. The routine then waits for the input of a TIMR signal and at the decision step 229 referred to in FIG. 5 the program awaits a TIMR signal. At this point in the DISP subroutine, the random time delay step 230 indicated in the master routine hereinabove, is initiated by the beginning of a TIMR signal at the decision step 229. As noted hereinabove, after a TIMR signal is initiated by the system and thereafter the HOLD signal is produced to initiate the sampling time instant. In the randomized or asynchronized sampling technique used herein, the time at which the HOLD signal is produced relative to the occurrence of the TIMR signal is randomly delayed. In the description of FIG. 4 hereinbelow, the pulse timing chart included therein illustrates the randomization of the sampling intervals provided by the operation of the system described hereinafter. Randomized sampling is to be understood to mean the occurrence of sampling at unequal sampling intervals that are independent of the phase, frequency and harmonics of the input signals and therefore characterized as asynchronous.

Randomization of a delay routine following the TIMR signal is accomplished by utilizing a source of randomly occurring data within the sequence controller and calculator subsystem 24. For example, following each sampling time, calculations of the parameters occur which produce random binary numbers. In the present technique, the four least significant bits of the KWH RAM accumulator register address 8C2 (shown in Table III) are treated as three bit magnitude numbers and a sign bit so as to form a sequence of 16 four bit data having a zero mean value as shown in Table V below. By providing an address for each of fifteen no operation or NOP microprocessor instructions, the microprocessor CPU 26 can alter the time between the beginning of a TIMR signal and the time a HOLD signal is initiated. In practice, this alters the sampling intervals by approximately ± 21 microseconds about a mean sampling interval time period since a NOP microprocessor instruction consumes ten clock cycles at 3.3 MHz. which is approximately three microseconds.

The Table V below sets forth the data information used to perform the random time delay operation included in the DISP routine. The data sequence column shows the sixteen possible binary states of the $D_{12}$, $D_{13}$, $D_{14}$, $D_{15}$ bit locations in the KWH (LSW) accumulator register that are arranged in a numerical sequence shown in the second column. A NOP delay sequence column has fifteen predetermined time delay steps since the data sequence has two zero numbers that are the same. The NOP delays are placed in PROM at 15 consecutive NOP addresses shown in the last column.

TABLE V

| | Data Sequence | | | Numerical Sequence | NOP Delay Sequence | NOP Addresses |
|---|---|---|---|---|---|---|
| ($D_{12}$) | ($D_{13}$) | ($D_{14}$) | ($D_{15}$) | | | |
| 0 | 0 | 0 | 1 | +1 | 1st NOP | 0394 |
| 0 | 0 | 1 | 0 | +2 | 2nd NOP | 0396 |
| 0 | 0 | 1 | 1 | +3 | 3rd NOP | 0398 |
| 0 | 1 | 0 | 0 | +4 | 4th NOP | 039A |
| 0 | 1 | 0 | 1 | +5 | 5th NOP | 039C |
| 0 | 1 | 1 | 0 | +6 | 6th NOP | 039E |
| 0 | 1 | 1 | 1 | +7 | 7th NOP | 03A0 |
| 0 | 0 | 0 | 0 | 0 | 8th NOP (mean) | 03A2 |
| 1 | 0 | 0 | 0 | 0 | 8th NOP (mean) | 03A2 |
| 1 | 0 | 0 | 1 | −1 | 9th NOP | 03A4 |
| 1 | 0 | 1 | 0 | −2 | 10th NOP | 03A6 |
| 1 | 0 | 1 | 1 | −3 | 11th NOP | 03A8 |
| 1 | 1 | 0 | 0 | −4 | 12th NOP | 03AA |
| 1 | 1 | 0 | 1 | −5 | 13th NOP | 03AC |
| 1 | 1 | 1 | 0 | −6 | 14th NOP | 03AE |
| 1 | 1 | 1 | 1 | −7 | 15th NOP | 03B0 |

By viewing the Table V it is seen that the mean of the numerical values between +7 and −7 (15 numbers) is zero. It is known in the field probability theory from Law of Large Numbers that the mean of a set of random numbers, such as found in the sequence of Table V, will be the numerical average value when samples of the random numbers are taken over a substantial number of occurrences of the random numbers. Accordingly, the 1st through the 7th consecutive NOP delay steps are sequentially programmed to provide seven delay steps above the mean or average delay step provided at the 8th NOP step and the 9th through 15th consecutive NOP operations are programmed to provide seven delay steps below the mean or 8th NOP step. Generally, the source of randomized four data bits is used to determine to what random point in the sequence of fifteen NOP instructions the program should jump and then execute the following remaining number of NOP instructions. The process involves establishing the mean value at the zero NOP instruction, which is midway between seven proceeding and seven following NOP instructions so that the delays have a mean delay time.

The following examples are to further explain the delay operations in the flow diagram of FIG. 7. At step 306, the four least significant bits of the KWH accumulator are obtained. This provides the aforementioned source of randomized data, which changes with each sample interval. At decision step 307, it is determined whether bit $D_{12}$ is logic zero or one and if the randomized data is plus and the output will be true. If the output is false the step 308 follows to take the two's complements of the four bit random data. This is to place the data in a positive domain for handling by the microprocessor system. At step 309 the randomized (jitter) offset is calculated.

One example of how the random effect of the delay periods is arrived at is as follows:
1. 0000000000000101
2. 0000000000001010
3. 0000001110100010 = 03A2
4. 0000001110101100 = 03AC The line (1) of the above example shows that the random data corresponding to +5 number was found in the KWH accumulator the line (2) indicates that there is the binary product of multiplication of (1) by two. The line (3) indicates the value of the mean or eighth NOP instruction which is added to line (2). The line (4) is the sum of (2) and (3) and is the address to which the program jumps. The address of 03AC is the thirteenth NOP in the above Table V. The delay executes the 13th, 14th and 15th NOP instructions for a total of approximately nine microseconds.

In another example, the following computation occurs when the random number −7 is detected.

| (1) | 0000000000000111 | |
|---|---|---|
| (2) | 1111111111111000 | |
| (3) | 1 | |
| (4) | 1111111111111001 | |
| (5) | 1111111111100010 | |
| (6) | 0000001110100010 | = 03A2 |
| (7) | 0000001110010100 | = 0394 |

The line (1) of the above indicates that the randomized data corresponding to −7 was found in the KWH accumulator. The lines (2) and (3) indicate that the two's complement of step 309 was calculated by inverting (1) and adding 1 since the random number was negative. The result of the two's complement is multiplied by two to give the result in the line (5). The address of the mean NOP instruction in line (6) is added to line (5) and the line (7) gives the resultant which is the address 0394. The first NOP instruction is located at 0394 so that the routine executes fifteen NOP operations producing an approximately 45 microsecond delay. The adding of the address 03A2 of the 8th and mean NOP instruction is required to cause the mean delay to be equal to the delay produced by stating with the 8th NOP step.

Returning now to the routine program of FIG. 7, it is seen that after the randomized jitter offset is calculated at step 309, step 310 follows and the offset address is added to the entry address. At step 311 the randomized delay is executed. The above-described routine is then ready to enter the master routine at the instruction label STRT. The above delay routine produces the random delay between the TIMR and HOLD signals as shown in FIG. 4 described below.

Referring now to FIG. 8, there is shown the A/D converter input subroutine INP following the random time delay of step 230 in FIG. 5 which is effective to initiate the HOLD signal to the sample and hold circuits in FIG. 2A. The I/O control workspace beginning at address 820 is utilized in the INP subroutine. The program sets the workspace pointer in the microprocessor CPU 26 to address 820 and Reg. R0. At step 312, the multiplexer address is set in the Reg. R0 and at step 313 the Reg. R1 is set to the address at which the data is to be stored. This process is repeated for each of the six input variables $V_A$, $V_B$, $V_C$, $I_A$, $I_B$, $I_C$. The registers in the data input conditioning workspace are shown in Table III where the Regs. R0 and R1 are moved to locations 876 and 87A. A microprocessor workspace pointer is moved to address 860 for the first input variable $V_A$. At step 315, the output of the multiplexer address is made for the selected input sampled value and at step 315 the start conversion is initiated. At the decision step 316, the program waits until the data conversion is done, which is indicated by the STAT signal from the A/D converter 38 in FIG. 2A. When the data conversion is complete, the eleven bit magnitude and the sign bit is input to the input interface 32 at step 317. The sign is determined in decision step 318 and the magnitude is stored at the address contained in Reg. R13. The storage of data in the sign/magnitude format is necessary because the multiplication and division instruction for the type TMS 9900 microprocessor CPU 26 requires unsigned binary numbers. If the data is positive, the step 319 follows and sets the sign flag positive. If the data is negative, the step 320 follows and the absolute value is derived and step 321 sets the sign flag negative. The registers for the sign flags are designated at the locations in the data input conditioning workspace of Table III. The subroutine of FIG. 8 is then complete after repeating for each of the six input variables as noted hereinabove.

Figure 9:
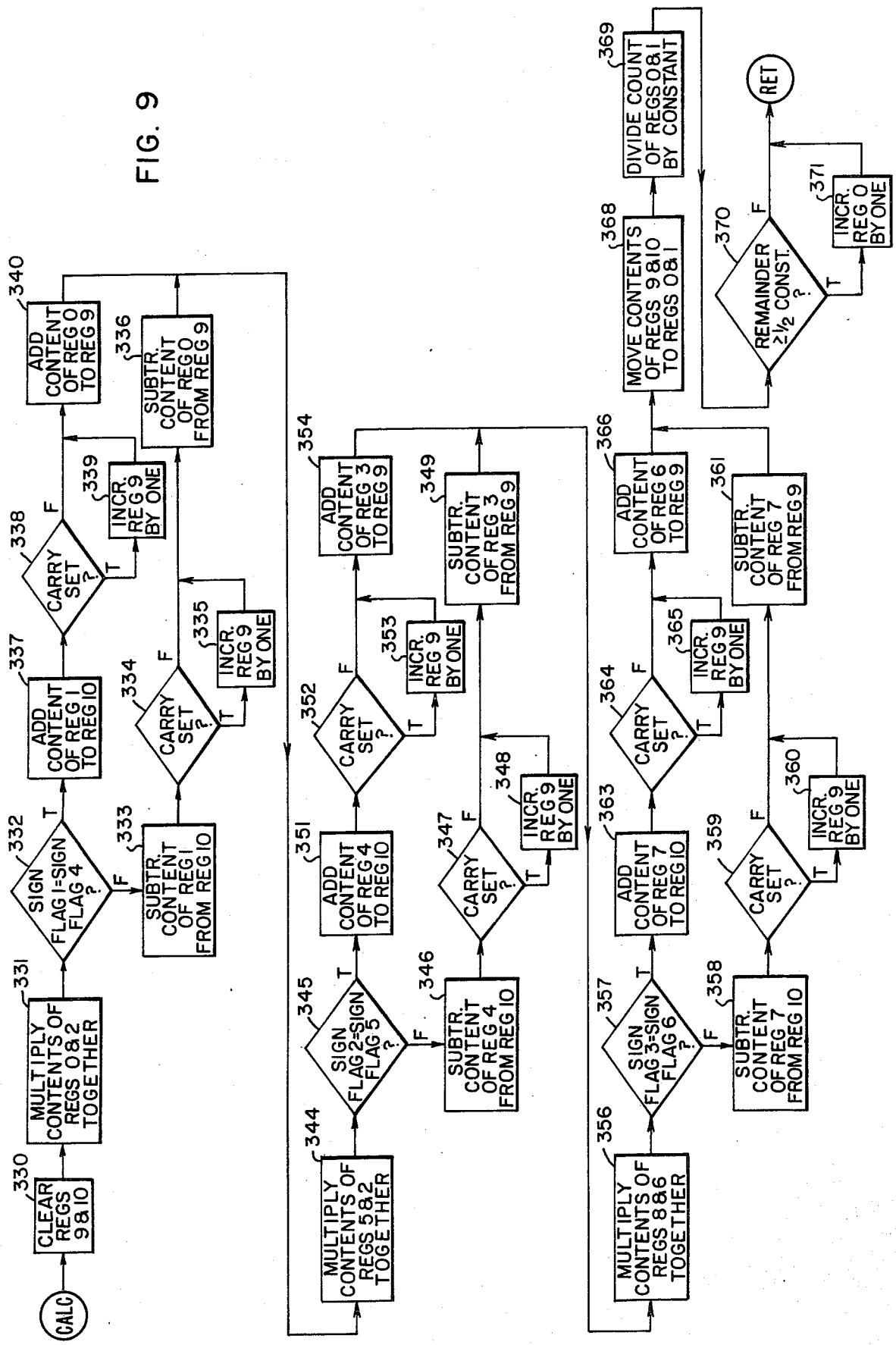
FIG. 9 illustrates a calculate (CALC) subroutine designated in the flow diagram shown in FIG. 5.

In FIG. 9, the CALC calculation subroutine is shown as it is performed after the input variables have been sampled, digitized and stored for calculation. The three parameters of the electric energy quantity to be measured are produced by the outputs of the system 20 are calculated in a common calculation subroutine and the same subroutine can be used for calculating each of the parameters with slight variations. Accordingly, it is only necessary to pass the parameters, in the correct sequence, to the CALC subroutine which performs the computations. The calculation workspace in RAM 28 is shown in Table III, beginning at the address 840 for the Reg. R0.

Pulse data output signals are produced whose periods are proportional to the rate of change of the calculated quantities in accordance with the equations hereinbelow. The equations calculated in the system 20 are:

$$\Delta 3\phi KW = (V{A_A}^* \cdot {I_A}^* + {V_B}^* \cdot {I_B}^* + {V_C}^* \cdot {I_C}^*)/(\text{constant} = 385)$$

$$\Delta 3\phi QHR = [(-{V_C}^*) \cdot {I_A}^* + (-{V_A}^* \cdot {I_B}^*) + (-{V_B}^* \cdot {I_C}^*)]/(\text{constant} = 385)$$

$$\Delta VSQ = ({V_A}^* \cdot {V_A}^*) + (X \cdot X) + (Y \cdot Y)$$

where $V^*$ and $I^*$ quantities are the instantaneous sampled values of the input voltages and currents and $X$ and $Y$ are equal to zero.

It is seen in each of the above equations that the sum of three products is calculated and that there is a division by a constant which is determined by the levels of the input signals and the limits of 16 bit data against which the calculated values are compared. The $\Delta$ increments are the calculated instantaneous value of kilowatts, Q and volts-squared. The accumulations of the $\Delta$ increments calculated each sampling interval provides the integrals with respect to time for kilowatts, Q and volts-squared to produce the desired measured parameters of kilowatt-hours, Q-hours and volts-squared-hours. In the last equation, only the value of the square of the voltage of phase A is calculated, therefore, two product terms in the equation include X's and Y's that are set to zero in the process utilizing a common calculation subroutine. As is known in electric energy metering, instantaneous incremental quantities are derived and accumulated over a time interval to provide the time integration required to derive a parameter of an electric energy quantity. Accordingly, the instantaneous input signal values are sampled and used in the calculations of the above equations and these results are stored in the variable accumulator registers shown at locations 8C0 through 8DE. When predetermined limits in the accumulators are reached, the flags are set and the pulse outputs are produced with the accumulators retaining the remainder in excess of the limit for addition to new accumulations. The output pulse circuits are made to change the direction of current or logic state upon reaching the limit of an associated accumulator register.

Referring now to the CALC subroutine shown in FIG. 9 and referring to the calculation workspace registers in Table III, the computations are generally performed by multiplying each pair of variables and accumulating the sum of the products in the register pair formed by Regs. R9 and R10. The subroutine involves double precision calculation done in thirty two bits of two sixteen bit words. In step 330, the Regs. R9 and R10 are cleared, the contents of Regs. R2 and R0 are multiplied together in step 331 to provide a thirty-two bit result. In the decision step 332, a comparison is determined as to whether the sign flag one is equal to sign flag four; if false, the contents of Reg. R1 is subtracted from the content of Reg. R10 in step 333. At the decision step 334, it is determined whether carry set is true or false. If true, Reg. R9 is incremented by one in step 235. If the decision in step 334 is false, then step 336 subroutine the contents of Reg. R0 from the contents of Reg. R9. Returning to step 332, if the decision is true, the contents of Reg. R1 are added to the contents of Reg. R10 and the decision step 338 determines if carry is set. If true, the step 339 causes Reg. R9 to be incremented by one and if the decision of step 338 is flase, the step 340 adds the contents of Reg. R0 to Reg. R9. The subroutine of FIG. 9 thus described performs one of the three sets of multiplications and addition to the temporary registers R9 and R10.

From the steps 336 and 340 the subroutine continues to step 344 where the contents of Regs. R5 and R2 are multiplied together and at step 345 the decision is made to determine whether sign flag two equals sign flag five. If step 345 is false, a subtraction step 346 is performed similar to the step 333 followed by a decision step 347 corresponding to the decision step 334; and if true, a step 348 corresponding to step 335 is performed; and if false, a step 349 is performed corresponding to the subtraction step of 336. Correspondingly, the true result of step 345 goes to an addition step in step 351 corresponding to the addition step of 337 followed by a decision step 352 corresponding to the decision step of 338 and if true, an incrementing step 353 corresponding to the incrementing step of 339 occurs; and if false, an addition step 354 occurs corresponding to the addition step 340, with the designated registers being utilized in the steps 346 through 354.

Following the steps 349 and 354 which completes the second set of multiplications, the subroutine goes to step 356 where the contents of Regs. R8 and R6 are multiplied together. This begins the third multiplication operation required in accordance with the equations described hereinabove. At decision step 357, the decision is made whether sign flag three equals sign flag six. If false, the subtraction step 358, the decision step 359, the incrementing step 360 and subtraction step 361 are performed corresponding to the steps 333 through 376, while utilizing the different registers indicated in the steps 358 through 361. Correspondingly, if the true result is determined at the step 357, the addition step of 363, the decision step of 364, the incrementing step 365 and the addition step 366 are performed corresponding to the steps 337 through 340, utilizing the different registers indicated in the steps 363 through 366.

Upon completion of the third multiplication operation at the step 361 or 366, the step 368 is executed by moving the contents of Regs. R9 and R10 to Regs. R0 and R1. The computed incremental values are totalized therein. In step 369 the count of Regs. R0 and R1 is divided by 358. At decision step 370, it is determined whether the remainder is greater than or equal to one half of the constant; and if true, the step 371 increments Reg. R0 by one, and if false, both step 370 and 371 return to the master routine. As noted hereinabove, after the sum of the product terms is computed, the thirty-two bit result is divided by 358 in order to reduce the word length to sixteen bits with the division employing 5/4 rounding. The sixteen bit result from the calculation subroutine is then loaded into location 8A0 in the limit comparison workspace. As noted hereinabove in connection with the description of the master routine shown in FIG. 5, the CALC calculation subroutine routine must be performed three times in order to calculate the three phase KWH, the $V^2H$ and QHR parameters. Following each calculation, the limits of routine is performed as described hereinafter.

Reference is now made to FIG. 10 showing a flow chart diagram of the LIMC limit comparison subroutine. Reference is made to the limit comparison subroutine and the variable accumulator registers shown in Table III in the description of FIG. 10. The limit comparison subroutine is used for all four output trains as shown in FIG. 5. The workspace registers R7 through R15 contain the limits for each parameter; and to use the subroutine, it is necessary to load the Δ increment from the CALC subroutine, the accumulating register for the output function being computed, and the output limit value. As noted above, the results of CALC subroutine is the Δ increments to the time integral of the parameters being measured. The LIMC subroutine then computes the double precision sum of the accumulator and the Δ increments and compares this to the output limit. When the limit is exceeded, the subroutine resets the accumulator to the difference between the accumulator value and the limit value and sets the output flag for the particular output parameter.

At step 380 in FIG. 10, the Reg. R0 contents are added to the Reg. R2. At the decision step 381, the state of carry set is determined. If true, Reg. R1 is increased by one in step 382 and the step 381, if false and the step 382 are followed by a decision step 383 to determine if Reg. R2 is greater or equal to Reg. R4. If true, the decision step 384 determines if Reg. R1 is greater or equal to Reg. R3. If the result of step 383 is false, the step 385 follows to determine if Reg. R1 is greater than Reg. R3. If true, the step 386 is executed which subtracts the contents of Reg. R4 from Reg. R2. If the result of step 384 is false, the program goes, as does the false result of step 385 to step 387. The contents of Reg. R6 is added to the contents of Reg. R11 at the step 387 and the subroutine returns to the master routine. The decision step 389 follows the step 386 to determine the state of carry set. If true, step 390 increases Reg. R1 by one and returns along with the false result of the step 389 to step 391 to subtract the content of Reg. R3 from Reg. R1 and the LIMC subroutine returns to the master routine, as noted hereinabove.

Following the completion of the CALC calculation and LIMC limit comparison the program goes to the DINC subroutine shown in FIG. 11 and tests each output flag. If a flag has been set, the LIMC subroutine causes the incrementing of the display register associated with the varible output parameter. Testing each output in sequence allows the setting of the register base address in Reg. R0 of the display register BCD increment workspace beginning at address 880 which is utilized in the DINC display register BCD increment subroutine illustrated in FIG. 11. If an output flag has been set during the limit comparison portion of the program, the DINC display increment subroutine causes the incrementing of the display register in base ten rather than binary to facilitate the display of the parameter during the display service routine described earlier in connection with the DISP routine. In the DINC routine of FIG. 11, step 395 sets counter in Reg. R1 to zero. At decision step 396, it is determined whether or not the digit addressed is equal to 9. The least significant digit addressed by Reg. R0 is checked to determine if it is equal to 9 at the step 396. If false, the decision 397 determines whether the digit addressed is equal to 10. This prevents non-essential zeroes in the digit display and is referred to as zero blanking by the program. If the result of the decision step 397 is false, step 398 increments by one and returns to the master program. If the decision is true in step 397, the step 399 sets digit equal to one and returns to the master program. If the result of the step 396 is true, step 401 sets the digit to zero and step 402 obtains the next digit which is followed by step 403 which increments by one. The decision step 404 follows the step 403 to determine whether the count is equal to 8. If true, the program returns to the master routine; and if false, the program returns to the beginning of the decision step 396 to look for another 9.

Reference is now made to the OPUT output pulse subroutine shown in FIG. 12. The system tests the output flags included in the output flag register having the eight flag bits tested at the same time. As shown in FIG. 5, the OPUT subroutine must be executed for each of the four output parameters each having an associated flag. In decision step 406, it is determined whether the flag is set; if false, in each case the subroutine returns to the master routine. If the result of step 406 is true, the output flag is reset in step 407. The decision step 409 determines whether the last value is equal to one; if false, the value is set to equal one in step 410; if the result of step 409 is true, the step 411 sets the value to zero and at step 412 the output value is initiated. The latter steps of the output subroutine are to determine the binary logic state of the pulse output signal or the direction of the current through the recording heads and then to reverse the logic state and reverse the direction of current through the recording head of the associated pulse output signal. Following initiation of the pulse output signal, the subroutine of FIG. 12 returns to the master routine.

Referring now to FIG. 4 there is shown the pulse timing chart of signals shown in FIG. 2A to effect the randomized and asynchronous sampling of the input signals. The top pulses shown in FIG. 4 are the TIMR sample interval timer pulses produced by the sample timer 46. When the signal goes low at time T0, the system would normally respond with the RINT signal without the randomized delay as described in connection with the step 230 in FIG. 4 and in detail in the description of FIG. 7, showing the DISP subroutine. The times shown in FIG. 4 are to be understood to not be to scale so as to make more apparent the description of the operation of the random time delay to produce the randomized sample intervals. Accordingly, following time T0 in the occurrence of the falling edge of the TIMR signal, the source of random numbers having a mean zero value as described hereinabove, is obtained in the manner described for step 306 in FIG. 7. A delay subroutine is executed by determining the plus or minus values and the three magnitude bits of the random numbers, as shown in Table V. The data is then converted to a positive number in the case of a negative data number being sensed and then in both the case of the positive and negative number, the result is multiplied by two to give a second set of numbers which have a mean value about zero. The resulting number is then added or subtracted from the address of the 8th NOP delay step which is a constant value corresponding to the mean value of the sequence of delays to obtain the address in the series of 15 NOP microcomputer operations, each having an execution time of approximately 3 microseconds. If the delay routine is affected as described in the second example hereinabove where the delay routine begins execution at the first NOP address 0394, the longest delay of approximately 45 microseconds is effected to produce the rising TIMR pulse edge at time T1. The broken line T1' indicates the minimum delay in which there is a jump in the delay subroutine to the last address 03B0 in Table V and one NOP is executed and the broken line corresponding to a time T1" is the mean value of the delay which is the average which is produced by the randomized technique described hereinabove. This is also the time at which the routine will jump to the mean NOP address at 03A2. It is to be noted that ending of the TIMR pulse at the earlier times of T' and T" would result in correspondingly earlier times for the RINT and HOLD and remaining signals shown in FIG. 4 and such earlier times are not shown to simplify the FIG. 4.

At the end of the time delay routine, the RINT signal is initiated and goes positive to reset the sample timer 46 and return the TIMR signal to the zero logic level. At a substantially constant fixed time T2 after the RINT signal, the HOLD signal is initiated to start the sampling interval one. The SCON signal is applied to the A/D converter 38 and at the end of the conversion of each of the sampled input signal values, the STAT signals are produced. The HOLD signal goes to the low logic state to release the sample and hold circuits at time T3. The system then waits for the timeout of the TIMR signal at time T4 to initiate the sampling interval two. At time T4, the sample timer 46 initiates another TIMR signal, going low, and the random delay subroutine is executed and initiates the RINT signal at T5 to reset the TIMR and initiate a HOLD signal at time T6 so that the time between T2 and T6 defines the sampling interval one. The randomized time delay in developing the randomized sampling intervals is the time between, for example, T0 and T1, the beginning of the TIMR signal, and the beginning of the RINT signal, at times T1 and T5. The other times shown being substantially constant in the operation of the system. The HOLD signal is initiated at time T6, followed by the start conversion SCON signal at T6 and the STAT signals follow. The release of the HOLD signal occurs at time T7 waiting for the timeout of another TIMR signal at time T8 which ends at time T9 with the initiation of the RINT after the randomized delay to initiate a further HOLD signal at time T10, ending sampling interval two.

In the system disclosed hereinabove, the mean time value of the randomized sampling intervals between, for example, between times T2 and T6 and between T6 and T10 can be varied between one and one-half and three milliseconds with a mean sampling interval time of approximately 2.5 milliseconds having been employed in one preferred embodiment of this invention. Changes in the counter arrangement outputs at the pads 122 and 126 in the sample timer circuit 46 provide changes in the period of TIMR pulses following reset of the RINT signals. The random delay variations in the mean value occur approximately ± 22 milliseconds shorter or longer than the mean sampling value. The maximum variation between sampling intervals is approximately forty-five milliseconds or approximately one electrical degree at sixty Hz. This produces increased accuracy in the calculated values of the system 20 and avoids sensing the voltage and current signal components of the electric energy quantity being measured at the same sampled points in the sixty HZ. cycle, which frequency is also known to vary slightly in electric utility power line networks.

The randomized and asynchronous sampling provided herein is independent of the phase, fundamental frequency or harmonics of the fundamental frequency of the input signals. With limited numbers of sampling times occurring each cycle of the input signals, a given number of the binary representations of the randomly occurring instantaneous sampled signal values give more increased accuracy over the same number of sampled values that are synchronized with the input signals and have the same phase relationships with respect to the sampled signals. The random samples prevent erroneous results when the input signals are severely distorted from the ideal sinusoidal form. These distortions are known to be produced by some types of electrical loads such as those having solid state switching devices or having widely varying impedance characteristics. Also, if the sample times are known to be regular, it affords an opportunity for electric utility customers to vary their load characteristics to avoid true measurements at the regular samplings.

It is to be understood that obvious modifications and changes may be made to the system 20 as described hereinabove may be made by those skilled in the art without departing from the spirit and scope of this invention.

APPENDIX A

SMET1

| RECD | LOC | OBJ | SOURCE STATEMENT | |
|------|------|------|------|------|
| 0001 | | | IDT | 'SMET1' |
| 0002 | | 0834 | FLGR | EQU >834 |
| 0003 | | 086C | SG1 | EQU >86C |
| 0004 | | 086E | SG2 | EQU >86E |
| 0005 | | 0870 | SG3 | EQU >870 |
| 0006 | | 0872 | SG4 | EQU >872 |
| 0007 | | 0874 | SG5 | EQU >874 |
| 0008 | | 0876 | SG6 | EQU >876 |
| 0009 | | 08E4 | MSK0 | EQU >8E4 |
| 0010 | | 08E6 | MSK1 | EQU >8E6 |
| 0011 | | 08E8 | MSK2 | EQU >8E8 |
| 0012 | | 08EA | MSK3 | EQU >8EA |
| 0013 | | 08EC | MSK4 | EQU >8EC |
| 0014 | | 08EE | MSK5 | EQU >8EE |
| 0015 | | 08F0 | MSK6 | EQU >8F0 |
| 0016 | | 08F2 | MSK7 | EQU >8F2 |
| 0017 | 0000 | 0800 | | DATA >800 |
| 0018 | 0002 | 0098 | | DATA >98 |
| 0019 | 0004 | 080A | | DATA >80A |
| 0020 | 0006 | 080C | | DATA >80C |
| 0021 | 0008 | 0812 | | DATA >812 |
| 0022 | 000A | 0838 | | DATA >838 |
| 0023 | 000C | 0878 | | DATA >878 |
| 0024 | 000E | 0884 | | DATA >884 |
| 0025 | 0010 | 0886 | | DATA >886 |
| 0026 | 0012 | 0888 | | DATA >888 |
| 0027 | 0014 | 0890 | | DATA >890 |
| 0028 | 0016 | 0892 | | DATA >892 |
| 0029 | 0018 | 0894 | | DATA >894 |
| 0030 | 001A | 08AE | | DATA >8AE |
| 0031 | 001C | 08B0 | | DATA >8B0 |
| 0032 | 001E | 08B2 | | DATA >8B2 |
| 0033 | 0020 | 08B4 | | DATA >8B4 |
| 0034 | 0022 | 08B8 | | DATA >8B8 |
| 0035 | 0024 | 08BA | | DATA >8BA |
| 0036 | 0026 | 08BC | | DATA >8BC |
| 0037 | 0028 | 08BE | | DATA >8BE |
| 0038 | 002A | 08E4 | | DATA >8E4 |
| 0039 | 002C | 08E6 | | DATA >8E6 |

| RECD | LOC OBJ | | SOURCE STATEMENT | |
|------|---------|---|------------------|---|
| 0040 | 002E 08E8 | | DATA >8E8 | |
| 0041 | 0030 08EA | | DATA >8EA | |
| 0042 | 0032 08EC | | DATA >8EC | |
| 0043 | 0034 08EE | | DATA >8EE | |
| 0044 | 0036 08F0 | | DATA >8F0 | |
| 0045 | 0038 08F2 | | DATA >8F2 | |
| 0046 | 003A 08F4 | | DATA >8F4 | |
| 0047 | 003C 08F6 | | DATA >8F6 | |
| 0048 | 003E 08F8 | | DATA >8F8 | |
| 0049 | 0040 08FC | | DATA >8FC | |
| 0050 | 0042 0970 | | DATA >970 | |
| 0051 | 0044 0972 | | DATA >972 | |
| 0052 | 0046 0974 | | DATA >974 | |
| 0053 | 0048 0976 | | DATA >976 | |
| 0054 | 004A 0978 | | DATA >978 | |
| 0055 | 004C 097A | | DATA >97A | |
| 0056 | 004E 1E20 | | DATA >1E20 | |
| 0057 | 0050 1E10 | | DATA >1E10 | |
| 0058 | 0052 0970 | | DATA >0970 | |
| 0059 | 0054 1E30 | | DATA >1E30 | |
| 0060 | 0056 1E40 | | DATA >1E40 | |
| 0061 | 0058 0009 | | DATA >0009 | |
| 0062 | 005A 000A | | DATA >000A | |
| 0063 | 005C 0001 | | DATA >0001 | |
| 0064 | 005E 093E | | DATA >093E | |
| 0065 | 0060 094E | | DATA >094E | |
| 0066 | 0062 0008 | | DATA >0008 | |
| 0067 | 0064 0033 | | DATA >0033 | |
| 0068 | 0066 C285 | | DATA >C285 | |
| 0069 | 0068 0136 | | DATA >0136 | |
| 0070 | 006A 8F1E | | DATA >8F1E | |
| 0071 | 006C 0019 | | DATA >0019 | |
| 0072 | 006E E232 | | DATA >E232 | |
| 0073 | 0070 0046 | | DATA >0046 | |
| 0074 | 0072 8969 | | DATA >8969 | |
| 0075 | 0074 0001 | | DATA >0001 | |
| 0076 | 0076 0002 | | DATA >0002 | |
| 0077 | 0078 0004 | | DATA >0004 | |
| 0078 | 007A 0008 | | DATA >0008 | |
| 0079 | 007C 0010 | | DATA >0010 | |
| 0080 | 007E 0020 | | DATA >0020 | |
| 0081 | 0080 0040 | | DATA >0040 | |
| 0082 | 0082 0080 | | DATA >0080 | |
| 0083 | 0084 0100 | | DATA >0100 | |
| 0084 | 0086 0200 | | DATA >0200 | |
| 0085 | 0088 1E5A | | DATA >1E5A | |
| 0086 | 008A 0816 | | DATA >816 | |
| 0087 | 008C 4079 | | DATA >4079 | |
| 0088 | 008E 2430 | | DATA >2430 | |
| 0089 | 0090 1912 | | DATA >1912 | |
| 0090 | 0092 0378 | | DATA >0378 | |
| 0091 | 0094 0018 | | DATA >0018 | |
| 0092 | 0096 7F00 | | DATA >7F00 | |
| 0093 | 0098 020C | | LI R12,>1E10 | |
|      | 009A 1E10 | | | |
| 0094 | 009C 1D10 | | SBO 16 | DISABLE SAMP INT TIMER |
| 0095 | 009E 1E07 | | SBZ 7 | RESET TEST LIGHT |
| 0096 | 00A0 1E14 | | SBZ 20 | RESET BAT FAIL |
| 0097 | 00A2 0200 | BEGN | LI R0,>04 | BEGIN MEM CHECK |
|      | 00A4 0004 | | | |
| 0098 | 00A6 0201 | | LI R1,>004E | LOAD THE BASE ADDRESS |
|      | 00A8 004E | | | |
| 0099 | 00AA C0B0 | RLB1 | MOV *R0+,R2 | GET MEM ADR |
| 0100 | 00AC 8C52 | | C *R2,*R1+ | COMPARE RAM TO PROM |
| 0101 | 00AE 1606 | | JNE RSET | RELOAD IF NOT EQUAL |

| RECD | LOC OBJ | SOURCE STATEMENT | |
|---|---|---|---|
| 0102 | 00B0 0280 | | CI R0,>4E | TEST IF DONE |
| | 00B2 004E | | | |
| 0103 | 00B4 16FA | | JNE RLB1 | |
| 0104 | 00B6 1E10 | | SBZ 16 | ENABLE SAMP INT TIMER |
| 0105 | 00B8 0460 | | B @START | |
| | 00BA 02A4' | | | |
| 0106 | 00BC 04C0 | RSET | CLR R0 | |
| 0107 | 00BE 0201 | | LI R1,>804 | |
| | 00C0 0804 | | | |
| 0108 | 00C2 CC40 | RLB0 | MOV R0,*R1+ | INIT MEM TO ZERO |
| 0109 | 00C4 0281 | | CI R1,>900 | TEST IF DONE |
| | 00C6 0900 | | | |
| 0110 | 00C8 16FC | | JNE RLB0 | |
| 0111 | 00CA 0200 | | LI R0,>0004 | |
| | 00CC 0004 | | | |
| 0112 | 00CE 0201 | | LI R1,>004E | |
| | 00D0 004E | | | |
| 0113 | 00D2 C0B0 | RLB2 | MOV *R0+,R2 | GET MEM ADR |
| 0114 | 00D4 C4B1 | | MOV *R1+,*R2 | MOVE CONSTANT TO RAM |
| 0115 | 00D6 0280 | | CI R0,>004E | TEST IF DONE |
| | 00D8 004E | | | |
| 0116 | 00DA 16FB | | JNE RLB2 | |
| 0117 | 00DC 0200 | | LI R0,>000A | |
| | 00DE 000A | | | |
| 0118 | 00E0 0201 | | LI R1,>900 | SET BASE ADR |
| | 00E2 0900 | | | |
| 0119 | 00E4 CC40 | RLB3 | MOV R0,*R1+ | INIT DISPLAY REGS |
| 0120 | 00E6 0281 | | CI R1,>960 | TEST IF DONE |
| | 00E8 0960 | | | |
| 0121 | 00EA 16FC | | JNE RLB3 | |
| 0122 | 00EC 0200 | | LI R0,>0008 | |
| | 00EE 0008 | | | |
| 0123 | 00F0 CC40 | RLB4 | MOV R0,*R1+ | DO THE DISP TEST REG |
| 0124 | 00F2 0281 | | CI R1,>970 | TEST IF DONE |
| | 00F4 0970 | | | |
| 0125 | 00F6 16FC | | JNE RLB4 | |
| 0126 | 00F8 04C0 | | CLR R0 | |
| 0127 | 00FA 020C | | LI R12,>1E00 | INIT OUTPUT PORTS 1E00-1E1E |
| | 00FC 1E00 | | | |
| 0128 | 00FE 3000 | | LDCR R0,0 | |
| 0129 | 0100 020C | | LI R12,>1E20 | |
| | 0102 1E20 | | | |
| 0130 | 0104 3000 | | LDCR R0,0 | INIT OUTPUT PORTS 1E20-1E3E |
| 0131 | 0106 020C | | LI R12,>1E10 | |
| | 0108 1E10 | | | |
| 0132 | 010A 1D14 | | SBO 20 | SET BATTERY FAIL LIGHT |
| 0133 | 010C 02E0 | | LWPI >820 | |
| | 010E 0820 | | | |
| 0134 | 0110 026A | | ORI R10,>1000 | |
| | 0112 1000 | | | |
| 0135 | 0114 02E0 | | LWPI >800 | |
| | 0116 0800 | | | |
| 0136 | 0118 020A | | LI R10,>8080 | |
| | 011A 8080 | | | |
| 0137 | 011C 0460 | | B @BEGN | |
| | 011E 00A2' | | | |
| 0138 | 0120 0280 | LIMC | CI R0,>8000 | |
| | 0122 8000 | | | |
| 0139 | 0124 1412 | | JHE KL6 | JUMP IF DELTA NEG |
| 0140 | 0126 A080 | | A R0,R2 | ADD DELTA TO ACCUM |
| 0141 | 0128 1701 | | JNC KL4 | |
| 0142 | 012A 0581 | | INC R1 | |
| 0143 | 012C 8102 | KL4 | C R2,R4 | TEST LS WORD OF ACCUM TO LIMIT |

```
RECD    LOC OBJ      SOURCE STATEMENT 0144    012E 1405            JHE KL0
0145    0130 80C1            C R1,R3           COMPARE MS WORDS
0146    0132 1B06            JH KL1
0147    0134 022B    KL5     AI R11,>6         OFFSET RET ADR TO SKIP OUTPUT SET
        0136 0006
0148    0138 045B            RT
0149    013A 80C1    KL0     C R1,R3           C MS WORDS
0150    013C 1401            JHE KL1
0151    013E 10FA            JMP KL5
0152    0140 6084    KL1     S R4,R2           CALC LS WORD OF REMAINDER
0153    0142 1701            JNC KL2           JUMP IF NO BORROW
0154    0144 0581            INC R1
0155    0146 6043    KL2     S R3,R1           CALC MS WORD OF REMAINDER
0156    0148 045B            RT
0157    014A A080    KL6     A R0,R2           ADD DELTA TO ACCUM
0158    014C 1701            JNC KL7
0159    014E 0581            INC R1
0160    0150 0221    KL7     AI R1,>FFFF       COMPLETE 2'S COMPLIMENT ADDITION
        0152 FFFF
0161    0154 10EB            JMP KL4
0162    0156 2281    OPUT    COC R1,R10        TEST DEFINED OUTPUT FLAG
0163    0158 1301            JEQ OP1
0164    015A 045B            RT
0165    015C 4281    OP1     SZC R1,R10        RESET OUTPUT FLAG
0166    015E 2282            COC R2,R10        TEST LAST VALUE OUTPUT
0167    0160 1302            JEQ OP2           JUMP IF LAST VAL=1
0168    0162 E282            SOC R2,R10        SET LAST VAL
0169    0164 1001            JMP OP3
0170    0166 4282    OP2     SZC R2,R10        SET LAST VAL=0
0171    0168 320A    OP3     LDCR R10,8        OUTPUT VALUE
0172    016A 045B            RT
0173    016C 04C1    DINC    CLR R1            BCD INCREMENT ROUTINE
0174    016E 8090    DL1     C *R0,R2
0175    0170 1304            JEQ DL2
0176    0172 80D0            C *R0,R3
0177    0174 1309            JEQ DL3
0178    0176 0590            INC *R0
0179    0178 045B            RT
0180    017A 04D0    DL2     CLR *R0
0181    017C 05C0            INCT R0
0182    017E 0581            INC R1
0183    0180 0281            CI R1,8
        0182 0008
0184    0184 16F4            JNE DL1
0185    0186 045B            RT
0186    0188 C404    DL3     MOV R4,*R0
0187    018A 045B            RT
0188    018C 04C9    CALC    CLR R9
0189    018E 04CA            CLR R10
0190    0190 020D            LI R13,>86C       LOAD BASE SIGN ADR
        0192 086C
0191    0194 020E            LI R14,>872
        0196 0872
0192    0198 3802            MPY R2,R0
0193    019A 8FBD            C *R13+,*R14+
0194    019C 1305            JEQ LB1
0195    019E 0541            INV R1
```

| RECD | LOC OBJ | | SOURCE STATEMENT |
|---|---|---|---|
| 0196 | 01A0 0581 | | INC R1 |
| 0197 | 01A2 0540 | | INV R0 |
| 0198 | 01A4 1701 | | JNC LB1 |
| 0199 | 01A6 0580 | | INC R0 |
| 0200 | 01A8 A281 | LB1 | A R1,R10 |
| 0201 | 01AA 1701 | | JNC LB2 |
| 0202 | 01AC 0589 | | INC R9 |
| 0203 | 01AE A240 | LB2 | A R0,R9 |
| 0204 | 01B0 38C5 | | MPY R5,R3 |
| 0205 | 01B2 8FBD | | C *R13+,*R14+ |
| 0206 | 01B4 1305 | | JEQ LB3 |
| 0207 | 01B6 0544 | | INV R4 |
| 0208 | 01B8 0584 | | INC R4 |
| 0209 | 01BA 0543 | | INV R3 |
| 0210 | 01BC 1701 | | JNC LB3 |
| 0211 | 01BE 0583 | | INC R3 |
| 0212 | 01C0 A284 | LB3 | A R4,R10 |
| 0213 | 01C2 1701 | | JNC LB4 |
| 0214 | 01C4 0589 | | INC R9 |
| 0215 | 01C6 A243 | LB4 | A R3,R9 |
| 0216 | 01C8 3988 | | MPY R8,R6 |
| 0217 | 01CA 879D | | C *R13,*R14 |
| 0218 | 01CC 1305 | | JEQ LB5 |
| 0219 | 01CE 0547 | | INV R7 |
| 0220 | 01D0 0587 | | INC R7 |
| 0221 | 01D2 0546 | | INV R6 |
| 0222 | 01D4 1701 | | JNC LB5 |
| 0223 | 01D6 0586 | | INC R6 |
| 0224 | 01D8 A287 | LB5 | A R7,R10 |
| 0225 | 01DA 1701 | | JNC LB6 |
| 0226 | 01DC 0589 | | INC R9 |
| 0227 | 01DE A246 | LB6 | A R6,R9 |
| 0228 | 01E0 C009 | | MOV R9,R0 |
| 0229 | 01E2 C04A | | MOV R10,R1 |
| 0230 | 01E4 0202 | | LI R2,>0181 |
| | 01E6 0181 | | |
| 0231 | 01E8 0249 | | ANDI R9,>8000 |
| | 01EA 8000 | | |
| 0232 | 01EC 1614 | | JNE LB16 |
| 0233 | 01EE 04C3 | | CLR R3 |
| 0234 | 01F0 3C02 | LB17 | DIV R2,R0 |
| 0235 | 01F2 1903 | | JNO LB13 |
| 0236 | 01F4 04C0 | | CLR R0 |
| 0237 | 01F6 04C1 | | CLR R1 |
| 0238 | 01F8 1003 | | JMP LB15 |
| 0239 | 01FA 0281 | LB13 | CI R1,>0080 |
| | 01FC 0080 | | |
| 0240 | 01FE 1409 | | JHE LB14 |
| 0241 | 0200 0283 | LB15 | CI R3,0 |
| | 0202 0000 | | |
| 0242 | 0204 1305 | | JEQ LB18 |
| 0243 | 0206 0541 | | INV R1 |
| 0244 | 0208 0581 | | INC R1 |
| 0245 | 020A 0540 | | INV R0 |
| 0246 | 020C 1701 | | JNC LB18 |
| 0247 | 020E 0580 | | INC R0 |
| 0248 | 0210 045B | LB18 | RT |
| 0249 | 0212 0580 | LB14 | INC R0 |
| 0250 | 0214 10F5 | | JMP LB15 |
| 0251 | 0216 0703 | LB16 | SETO R3 |
| 0252 | 0218 0541 | | INV R1 |
| 0253 | 021A 0581 | | INC R1 |
| 0254 | 021C 0540 | | INV R0 |
| 0255 | 021E 17E8 | | JNC LB17 |

| RECD | LOC OBJ | SOURCE STATEMENT | |
|---|---|---|---|
| 0256 | 0220 0580 | | INC R0 |
| 0257 | 0222 10E6 | | JMP LB17 |
| 0258 | 0224 C800 | INP | MOV R0,@>876 |
| | 0226 0876 | | |
| 0259 | 0228 C801 | | MOV R1,@>87A |
| | 022A 087A | | |
| 0260 | 022C 02E0 | | LWPI >860 |
| | 022E 0860 | | |
| 0261 | 0230 06CB | | SWPB R11 |
| 0262 | 0232 020C | | LI R12,>1E02 |
| | 0234 1E02 | | |
| 0263 | 0236 30CB | | LDCR R11,3 |
| 0264 | 0238 020C | | LI R12,>1E00 |
| | 023A 1E00 | | |
| 0265 | 023C 1D00 | | SBO 0 |
| 0266 | 023E 1E00 | | SBZ 0 |
| 0267 | 0240 020C | | LI R12,>1E40 |
| | 0242 1E40 | | |
| 0268 | 0244 1F0C | INP2 | TB >C | TEST CONVERSION COMPLETE
| 0269 | 0246 13FE | | JEQ INP2 |
| 0270 | 0248 36DD | | STCR *R13,11 |
| 0271 | 024A 1F0B | | TB >B |
| 0272 | 024C 160C | | JNE INP1 |
| 0273 | 024E 055D | | INV *R13 |
| 0274 | 0250 059D | | INC *R13 |
| 0275 | 0252 C3DD | | MOV *R13,R15 |
| 0276 | 0254 024F | | ANDI R15,>07FF |
| | 0256 07FF | | |
| 0277 | 0258 C74F | | MOV R15,*R13 |
| 0278 | 025A 022D | | AI R13,12 |
| | 025C 000C | | |
| 0279 | 025E 071D | | SETO *R13 |
| 0280 | 0260 02E0 | | LWPI >820 |
| | 0262 0820 | | |
| 0281 | 0264 045B | | RT |
| 0282 | 0266 022D | INP1 | AI R13,12 |
| | 0268 000C | | |
| 0283 | 026A 04DD | | CLR *R13 |
| 0284 | 026C 02E0 | | LWPI >820 |
| | 026E 0820 | | |
| 0285 | 0270 045B | | RT |
| 0286 | 0272 C149 | CMPR | MOV R9,R5 | PDEM ADR TO R5
| 0287 | 0274 C188 | | MOV R8,R6 | DEM ADR TO R6
| 0288 | 0276 C1CA | | MOV R10,R7 | COUNT TO R7
| 0289 | 0278 8595 | CL1 | C *R5,*R6 |
| 0290 | 027A 1506 | | JGT CL2 | J'JMP IF PDEM>DEM
| 0291 | 027C 1108 | | JLT CL3 | JUMP IF PDEM<DEM
| 0292 | 027E 0645 | | DECT R5 | GET NEXT PDEM DIGIT
| 0293 | 0280 0646 | | DECT R6 | GET NEXT DEM DIGIT
| 0294 | 0282 0607 | | DEC R7 | COUNT=COUNT-1
| 0295 | 0284 16F9 | | JNE CL1 | TEST IF DONE
| 0296 | 0286 045B | | RT | PDEM=DEM
| 0297 | 0288 80D5 | CL2 | C *R5,R3 | PDEM DIGIT = >A
| 0298 | 028A 1303 | | JEQ CL4 | PDEM<DEM
| 0299 | 028C 045B | | RT |
| 0300 | 028E 80D6 | CL3 | C *R6,R3 | DEM DIGIT=>A
| 0301 | 0290 1308 | | JEQ CL6 | PDEM>DEM,SO EXIT
| 0302 | 0292 C149 | CL4 | MOV R9,R5 |
| 0303 | 0294 C188 | | MOV R8,R6 |
| 0304 | 0296 C1CA | | MOV R10,R7 |
| 0305 | 0298 C556 | CL5 | MOV *R6,*R5 | REPLACE PDEM WITH DEM
| 0306 | 029A 0645 | | DECT R5 |

| RECD | LOC OBJ | | SOURCE STATEMENT | |
|------|---------|------|------|------|
| 0307 | 029C 0646 | | DECT R6 | |
| 0308 | 029E 0607 | | DEC R7 | |
| 0309 | 02A0 16FB | | JNE CL5 | TEST IF DONE |
| 0310 | 02A2 045B | CL6 | RT | EXIT |
| 0311 | 02A4 02E0 | START | LWPI >8E0 | |
|      | 02A6 08E0 | | | |
| 0312 | 02A8 36C0 | | STCR R0,11 | BEGIN SWITCH INP SUBROUTINE |
| 0313 | 02AA 400A | | SZC R10,R0 | MASK OFF SAMP INT TIMER |
| 0314 | 02AC 8040 | | C R0,R1 | |
| 0315 | 02AE 134F | | JEQ DISP | |
| 0316 | 02B0 C040 | | MOV R0,R1 | |
| 0317 | 02B2 2444 | | CZC R4,R1 | TEST /RESET |
| 0318 | 02B4 1604 | | JNE RS1 | |
| 0319 | 02B6 02E0 | | LWPI >800 | |
|      | 02B8 0800 | | | |
| 0320 | 02BA 0460 | | B @RSET | |
|      | 02BC 00BC | | | |
| 0321 | 02BE 2442 | RS1 | CZC R2,R1 | TEST PWRF |
| 0322 | 02C0 1327 | | JEQ SL1 | |
| 0323 | 02C2 2443 | | CZC R3,R1 | TEST DINT |
| 0324 | 02C4 1329 | | JEQ SL2 | |
| 0325 | 02C6 4342 | | SZC R2,R13 | RESET DINT FLAG |
| 0326 | 02C8 2449 | SL3 | CZC R9,R1 | TEST RDEM |
| 0327 | 02CA 1609 | | JNE SL4 | |
| 0328 | 02CC 020F | | LI R15,>94E | SET PEAK DEM REG BASE ADR |
|      | 02CE 094E | | | |
| 0329 | 02D0 0200 | | LI R0,>8 | SET COUNTER |
|      | 02D2 0008 | | | |
| 0330 | 02D4 C7E0 | SLP1 | MOV @>886,*R15 | ZERO THIS LOCATION |
|      | 02D6 0886 | | | |
| 0331 | 02D8 064F | | DECT R15 | GET NEXT ADR |
| 0332 | 02DA 0600 | | DEC R0 | |
| 0333 | 02DC 16FB | | JNE SLP1 | REPEAT IF NOT DONE |
| 0334 | 02DE 06C4 | SL4 | SWPB R4 | |
| 0335 | 02E0 2444 | | CZC R4,R1 | TEST RBEA |
| 0336 | 02E2 06C4 | | SWPB R4 | |
| 0337 | 02E4 1607 | | JNE SL5 | |
| 0338 | 02E6 02E0 | | LWPI >820 | |
|      | 02E8 0820 | | | |
| 0339 | 02EA 024A | | ANDI R10,>EFFF | |
|      | 02EC EFFF | | | |
| 0340 | 02EE 02E0 | | LWPI >8E0 | |
|      | 02F0 08E0 | | | |
| 0341 | 02F2 1EEF | | SBZ -17 | TURN OFF THE ALARM LIGHT |
| 0342 | 02F4 2445 | SL5 | CZC R5,R1 | TEST DTST |
| 0343 | 02F6 1318 | | JEQ SL6 | |
| 0344 | 02F8 2446 | | CZC R6,R1 | TEST DVSQ |
| 0345 | 02FA 131A | | JEQ SL7 | |
| 0346 | 02FC 2447 | | CZC R7,R1 | TET DQHR |
| 0347 | 02FE 131C | | JEQ SL8 | |
| 0348 | 0300 2448 | | CZC R8,R1 | TEST DDEM |
| 0349 | 0302 131E | | JEQ SL9 | |
| 0350 | 0304 244B | | CZC R11,R1 | TEST DKWH |
| 0351 | 0306 1320 | | JEQ SL10 | |
| 0352 | 0308 020F | | LI R15,>950 | BASE ADR=DISPLAY OFF |
|      | 030A 0950 | | | |
| 0353 | 030C C78F | | MOV R15,*R14 | |
| 0354 | 030E 101F | | JMP DISP | |
| 0355 | 0310 1DEB | SL1 | SBO -21 | RESET TIMER CHAIN |
| 0356 | 0312 1EEB | | SBZ -21 | |
| 0357 | 0314 1DF0 | | SBO -16 | |
| 0358 | 0316 0340 | | IDLE | STOP THE PROCESSOR |
| 0359 | 0318 2342 | SL2 | COC R2,R13 | TEST DINT FLAG |
| 0360 | 031A 13D6 | | JEQ SL3 | |

| RECD | LOC OBJ | | SOURCE STATEMENT | |
|---|---|---|---|---|
| 0361 | 031C E342 | | SOC R2,R13 | SET DINT FLAG |
| 0362 | 031E 020F | | LI R15,>93E | BASE ADR = DEMAND REG |
| | 0320 093E | | | |
| 0363 | 0322 0200 | | LI R0,8 | |
| | 0324 0008 | | | |
| 0364 | 0326 10D6 | | JMP SLP1 | |
| 0365 | 0328 020F | SL6 | LI R15,>960 | |
| | 032A 0960 | | | |
| 0366 | 032C C78F | | MOV R15,*R14 | |
| 0367 | 032E 100F | | JMP DISP | |
| 0368 | 0330 020F | SL7 | LI R15,>910 | |
| | 0332 0910 | | | |
| 0369 | 0334 C78F | | MOV R15,*R14 | |
| 0370 | 0336 100B | | JMP DISP | |
| 0371 | 0338 020F | SL8 | LI R15,>920 | |
| | 033A 0920 | | | |
| 0372 | 033C C78F | | MOV R15,*R14 | |
| 0373 | 033E 1007 | | JMP DISP | |
| 0374 | 0340 020F | SL9 | LI R15,>940 | |
| | 0342 0940 | | | |
| 0375 | 0344 C78F | | MOV R15,*R14 | |
| 0376 | 0346 1003 | | JMP DISP | |
| 0377 | 0348 020F | SL10 | LI R15,>900 | |
| | 034A 0900 | | | |
| 0378 | 034C C78F | | MOV R15,*R14 | |
| 0379 | 034E 02E0 | DISP | LWPI >800 | |
| | 0350 0800 | | | |
| 0380 | 0352 05C7 | | INCT R7 | |
| 0381 | 0354 0287 | | CI R7,>10 | |
| | 0356 0010 | | | |
| 0382 | 0358 1601 | | JNE DLB1 | |
| 0383 | 035A 04C7 | | CLR R7 | |
| 0384 | 035C C00B | DLB1 | MOV R11,R0 | |
| 0385 | 035E A007 | | A R7,R0 | |
| 0386 | 0360 C050 | | MOV *R0,R1 | |
| 0387 | 0362 A049 | | A R9,R1 | |
| 0388 | 0364 D011 | | MOVB *R1,R0 | |
| 0389 | 0366 31C0 | | LDCR R0,7 | |
| 0390 | 0368 0B1A | | SRC R10,1 | |
| 0391 | 036A C305 | | MOV R5,R12 | |
| 0392 | 036C 320A | | LDCR R10,8 | |
| 0393 | 036E 1F25 | OP8 | TB 37 | TEST TIMER INPUT |
| 0394 | 0370 13FE | | JEQ OP8 | |
| 0395 | 0372 C0A0 | | MOV @>8C2,R2 | LOAD LSW OF KWH ACCUM |
| | 0374 08C2 | | | |
| 0396 | 0376 0242 | | ANDI R2,>F | |
| | 0378 000F | | | |
| 0397 | 037A 20A0 | | COC @MSK3,R2 | TEST SIGN BIT |
| | 037C 08EA | | | |
| 0398 | 037E 1606 | | JNE JL1 | |
| 0399 | 0380 0242 | | ANDI R2,7 | MASK OFF SIGN |
| | 0382 0007 | | | |
| 0400 | 0384 0A12 | JL2 | SLA R2,1 | MULT JITTER BY 2 |
| 0401 | 0386 0222 | | AI R2,JADR | BIAS THE ENTRY ADDRESS |
| | 0388 03A2 | | | |
| 0402 | 038A 0452 | | B *R2 | JUMP TO BEGINING OF DELAY |
| 0403 | 038C 0242 | JL1 | ANDI R2,7 | JITTER IS NEGATIVE |
| | 038E 0007 | | | |
| 0404 | 0390 0502 | | NEG R2 | TAKE 2'S COMPLIMENT |
| 0405 | 0392 10F8 | | JMP JL2 | GO TO JITTER CALCULATION |
| 0406 | 0394 1000 | | NOP | FOLLOWING SEQUENCE INSERTS A |
| +/-45 | | | | |
| 0407 | 0396 1000 | | NOP | MICROSEC DELAY BETWEEN SAMPLE |

| RECD | LOC OBJ | | SOURCE STATEMENT | |
|---|---|---|---|---|
| INTERVAL | | | | |
| 0408 | 0398 1000 | | NOP | TIMEOUT AND THE NEXT SAMPLE |
| 0409 | 039A 1000 | | NOP | |
| 0410 | 039C 1000 | | NOP | |
| 0411 | 039E 1000 | | NOP | |
| 0412 | 03A0 1000 | | NOP | |
| 0413 | 03A2 1000 | JADR | NOP | |
| 0414 | 03A4 1000 | | NOP | |
| 0415 | 03A6 1000 | | NOP | |
| 0416 | 03A8 1000 | | NOP | |
| 0417 | 03AA 1000 | | NOP | |
| 0418 | 03AC 1000 | | NOP | |
| 0419 | 03AE 1000 | | NOP | |
| 0420 | 03B0 1000 | | NOP | |
| 0421 | 03B2 C306 | | MOV R6,R12 | |
| 0422 | 03B4 1DFD | | SBO -3 | SET HOLD CONTROL |
| 0423 | 03B6 1D10 | | SBO 16 | RESET SAMP INT TIMER |
| 0424 | 03B8 1E10 | | SBZ 16 | ENABLE SAMP INT TIMER |
| 0425 | 03BA 02E0 | | LWPI >820 | |
| | 03BC 0820 | | | |
| 0426 | 03BE 04C0 | STRT | CLR R0 | |
| 0427 | 03C0 0201 | | LI R1,>860 | |
| | 03C2 0860 | | | |
| 0428 | 03C4 06A0 | | BL @INP | |
| | 03C6 0224' | | | |
| 0429 | 03C8 05C0 | | INCT R0 | |
| 0430 | 03CA 05C1 | | INCT R1 | |
| 0431 | 03CC 06A0 | | BL @INP | |
| | 03CE 0224' | | | |
| 0432 | 03D0 05C0 | | INCT R0 | |
| 0433 | 03D2 05C1 | | INCT R1 | |
| 0434 | 03D4 06A0 | | BL @INP | |
| | 03D6 0224' | | | |
| 0435 | 03D8 0200 | | LI R0,1 | |
| | 03DA 0001 | | | |
| 0436 | 03DC 05C1 | | INCT R1 | |
| 0437 | 03DE 06A0 | | BL @INP | |
| | 03E0 0224' | | | |
| 0438 | 03E2 05C0 | | INCT R0 | |
| 0439 | 03E4 05C1 | | INCT R1 | |
| 0440 | 03E6 06A0 | | BL @INP | |
| | 03E8 0224' | | | |
| 0441 | 03EA 05C0 | | INCT R0 | |
| 0442 | 03EC 05C1 | | INCT R1 | |
| 0443 | 03EE 06A0 | | BL @INP | |
| | 03F0 0224' | | | |
| 0444 | 03F2 02E0 | | LWPI >860 | |
| | 03F4 0860 | | | |
| 0445 | 03F6 1EE5 | | SBZ -27 | |
| 0446 | 03F8 C800 | | MOV R0,@>840 | |
| | 03FA 0840 | | | |
| 0447 | 03FC C803 | | MOV R3,@>844 | |
| | 03FE 0844 | | | |
| 0448 | 0400 C801 | | MOV R1,@>846 | |
| | 0402 0846 | | | |
| 0449 | 0404 C804 | | MOV R4,@>84A | |
| | 0406 084A | | | |
| 0450 | 0408 C802 | | MOV R2,@>84C | |
| | 040A 084C | | | |
| 0451 | 040C C805 | | MOV R5,@>850 | |
| | 040E 0850 | | | |
| 0452 | 0410 02E0 | | LWPI >840 | |
| | 0412 0840 | | | |
| 0453 | 0414 06A0 | | BL @CALC | |
| | 0416 018C' | | | |

| RECD | LOC OBJ | SOURCE STATEMENT | |
|---|---|---|---|
| 0454 | 0418 C800 | MOV R0,@>8A0 | |
| | 041A 08A0 | | |
| 0455 | 041C 02E0 | LWPI >8A0 | |
| | 041E 08A0 | | |
| 0456 | 0420 0205 | LI R5,>8C0 | |
| | 0422 08C0 | | |
| 0457 | 0424 C075 | MOV *R5+,R1 | |
| 0458 | 0426 C095 | MOV *R5,R2 | |
| 0459 | 0428 C0C7 | MOV R7,R3 | |
| 0460 | 042A C108 | MOV R8,R4 | |
| 0461 | 042C 06A0 | BL @LIMC | TEST FOR KWH OVERFLOW |
| | 042E 0120' | | |
| 0462 | 0430 E820 | SOC @MSK1,@FLGR | SET KWH OUTPUT FLAG |
| | 0432 08E6 | | |
| | 0434 0834 | | |
| 0463 | 0436 C542 | MOV R2,*R5 | |
| 0464 | 0438 0645 | DECT R5 | |
| 0465 | 043A C541 | MOV R1,*R5 | |
| 0466 | 043C 0205 | LI R5,>8C4 | |
| | 043E 08C4 | | |
| 0467 | 0440 C075 | MOV *R5+,R1 | |
| 0468 | 0442 C095 | MOV *R5,R2 | |
| 0469 | 0444 C0C9 | MOV R9,R3 | |
| 0470 | 0446 C10A | MOV R10,R4 | |
| 0471 | 0448 06A0 | BL @LIMC | |
| | 044A 0120' | | |
| 0472 | 044C E820 | SOC @MSK7,@FLGR | SET TEST PULSE OUTPUT FLAG |
| | 044E 08F2 | | |
| | 0450 0834 | | |
| 0473 | 0452 C542 | MOV R2,*R5 | |
| 0474 | 0454 0645 | DECT R5 | |
| 0475 | 0456 C541 | MOV R1,*R5 | |
| 0476 | 0458 02E0 | LWPI >840 | |
| | 045A 0840 | | |
| 0477 | 045C C020 | MOV @>860,R0 | GET VA |
| | 045E 0860 | | |
| 0478 | 0460 C820 | MOV @>872,@>87E | |
| | 0462 0872 | | |
| | 0464 087E | | |
| 0479 | 0466 C820 | MOV @>86C,@>872 | |
| | 0468 086C | | |
| | 046A 0872 | | |
| 0480 | 046C C080 | MOV R0,R2 | |
| 0481 | 046E 04C3 | CLR R3 | |
| 0482 | 0470 04C4 | CLR R4 | |
| 0483 | 0472 04C5 | CLR R5 | |
| 0484 | 0474 04C6 | CLR R6 | |
| 0485 | 0476 04C7 | CLR R7 | |
| 0486 | 0478 04C8 | CLR R8 | |
| 0487 | 047A 06A0 | BL @CALC | |
| | 047C 018C' | | |
| 0488 | 047E C820 | MOV @>87E,@>872 | |
| | 0480 087E | | |
| | 0482 0872 | | |
| 0489 | 0484 C800 | MOV R0,@>8A0 | LOAD DELTA VSQ |
| | 0486 08A0 | | |
| 0490 | 0488 02E0 | LWPI >8A0 | |
| | 048A 08A0 | | |
| 0491 | 048C 0205 | LI R5,>8CC | |
| | 048E 08CC | | |
| 0492 | 0490 C075 | MOV *R5+,R1 | |
| 0493 | 0492 C095 | MOV *R5,R2 | |
| 0494 | 0494 C0CE | MOV R14,R3 | GET MS WORD OF VSQ LIMIT |

| RECD | LOC OBJ | SOURCE STATEMENT | |
|------|---------|------------------|---|
| 0495 | 0496 C10F | MOV R15,R4 | GET LS WORD OF VSQ LIMIT |
| 0496 | 0498 06A0 | BL @LIMC | |
|      | 049A 0120' | | |
| 0497 | 049C E820 | SOC @MSK3,@FLGR | SET VSQ OUTPUT FLAG |
|      | 049E 08EA | | |
|      | 04A0 0834 | | |
| 0498 | 04A2 C542 | MOV R2,*R5 | RESTOTE LSW OF ACCUM |
| 0499 | 04A4 0645 | DECT R5 | |
| 0500 | 04A6 C541 | MOV R1,*R5 | RESTORE MSW OF ACCUM |
| 0501 | 04A8 02E0 | LWPI >860 | |
|      | 04AA 0860 | | |
| 0502 | 04AC C802 | MOV R2,@>840 | MOVE DATA BLOCK TO CALC WORKSP |
|      | 04AE 0840 | | |
| 0503 | 04B0 C803 | MOV R3,@>844 | FOR THE QHR CALC ROUTINE |
|      | 04B2 0844 | | |
| 0504 | 04B4 C800 | MOV R0,@>846 | |
|      | 04B6 0846 | | |
| 0505 | 04B8 C804 | MOV R4,@>84A | |
|      | 04BA 084A | | |
| 0506 | 04BC C801 | MOV R1,@>84C | |
|      | 04BE 084C | | |
| 0507 | 04C0 C805 | MOV R5,@>850 | |
|      | 04C2 0850 | | |
| 0508 | 04C4 C3C8 | MOV R8,R15 | MOVE THE SIGN FLAGS AND |
| 0509 | 04C6 C207 | MOV R7,R8 | CHANGE THE SIGN OF THE VOLTAGES |
| 0510 | 04C8 0548 | INV R8 | |
| 0511 | 04CA C1C6 | MOV R6,R7 | |
| 0512 | 04CC 0547 | INV R7 | |
| 0513 | 04CE C18F | MOV R15,R6 | |
| 0514 | 04D0 0546 | INV R6 | |
| 0515 | 04D2 02E0 | LWPI >840 | |
|      | 04D4 0840 | | |
| 0516 | 04D6 06A0 | BL @CALC | |
|      | 04D8 018C' | | |
| 0517 | 04DA C800 | MOV R0,@>8A0 | LOAD DELTA QHR |
|      | 04DC 08A0 | | |
| 0518 | 04DE 02E0 | LWPI >8A0 | |
|      | 04E0 08A0 | | |
| 0519 | 04E2 0205 | LI R5,>8C6 | |
|      | 04E4 08C6 | | |
| 0520 | 04E6 C075 | MOV *R5+,R1 | |
| 0521 | 04E8 C095 | MOV *R5,R2 | |
| 0522 | 04EA C0CC | MOV R12,R3 | |
| 0523 | 04EC C10B | MOV R11,R4 | GET LS WORD OF QHR LIMIT |
| 0524 | 04EE 06A0 | BL @LIMC | |
|      | 04F0 0120' | | |
| 0525 | 04F2 E820 | SOC @MSK2,@FLGR | SET QHR OUTPUT FLAG |
|      | 04F4 08E8 | | |
|      | 04F6 0834 | | |
| 0526 | 04F8 C542 | MOV R2,*R5 | RESTORE LSW OF REMAINDER |
| 0527 | 04FA 0645 | DECT R5 | |
| 0528 | 04FC C541 | MOV R1,*R5 | RESTORE MSW OF REMAINDER |
| 0529 | 04FE 02E0 | LWPI >880 | BEGIN INCR OF REG |
|      | 0500 0880 | | |
| 0530 | 0502 C320 | MOV @FLGR,R12 | |
|      | 0504 0834 | | |
| 0531 | 0506 2320 | COC @MSK1,R12 | TEST KWH OUTPUT FLAG |
|      | 0508 08E6 | | |

| RECD | LOC OBJ | | SOURCE STATEMENT | |
|------|---------|-----|------------------|----|
| 0532 | 050A 160A | | JNE OT1 | |
| 0533 | 050C 0200 | | LI R0,>900 | LOAD KWH BASE ADR |
|      | 050E 0900 | | | |
| 0534 | 0510 06A0 | | BL @DINC | INC KWH REG |
|      | 0512 016C' | | | |
| 0535 | 0514 0200 | | LI R0,>930 | LOAD DEM BASE ADR |
|      | 0516 0930 | | | |
| 0536 | 0518 06A0 | | BL @DINC | INC DEM REG |
|      | 051A 016C' | | | |
| 0537 | 051C 06A0 | | BL @CMPR | COMPARE DEM TO PDEM |
|      | 051E 0272' | | | |
| 0538 | 0520 2320 | OT1 | COC @MSK2,R12 | QHR OUTPUT SET |
|      | 0522 08E8 | | | |
| 0539 | 0524 1604 | | JNE OT2 | |
| 0540 | 0526 0200 | | LI R0,>920 | SET QHR BASE ADR |
|      | 0528 0920 | | | |
| 0541 | 052A 06A0 | | BL @DINC | INC QHR REG |
|      | 052C 016C' | | | |
| 0542 | 052E 2320 | OT2 | COC @MSK3,R12 | VSQ OUTPUT FLAG SET? |
|      | 0530 08EA | | | |
| 0543 | 0532 1604 | | JNE OT3 | |
| 0544 | 0534 0200 | | LI R0,>910 | SET VSQ BASE ADR |
|      | 0536 0910 | | | |
| 0545 | 0538 06A0 | | BL @DINC | INC VSQ REG |
|      | 053A 016C' | | | |
| 0546 | 053C 02E0 | OT3 | LWPI >820 | BEGIN PULSE OUTPUT ROUTINE |
|      | 053E 0820 | | | |
| 0547 | 0540 22A0 | | COC @MSK1,R10 | TEST KWH FLAG |
|      | 0542 08E6 | | | |
| 0548 | 0544 1606 | | JNE OT4 | |
| 0549 | 0546 0201 | | LI R1,>02 | |
|      | 0548 0002 | | | |
| 0550 | 054A 0202 | | LI R2,>0200 | LOAD KWH MASKS |
|      | 054C 0200 | | | |
| 0551 | 054E 06A0 | | BL @OPUT | |
|      | 0550 0156' | | | |
| 0552 | 0552 22A0 | OT4 | COC @MSK2,R10 | TEST QHR FLAG |
|      | 0554 08E8 | | | |
| 0553 | 0556 1606 | | JNE OT5 | |
| 0554 | 0558 0201 | | LI R1,>04 | |
|      | 055A 0004 | | | |
| 0555 | 055C 0202 | | LI R2,>0400 | |
|      | 055E 0400 | | | |
| 0556 | 0560 06A0 | | BL @OPUT | |
|      | 0562 0156' | | | |
| 0557 | 0564 22A0 | OT5 | COC @MSK3,R10 | TEST VSQ FLAG |
|      | 0566 08EA | | | |
| 0558 | 0568 1606 | | JNE OT6 | |
| 0559 | 056A 0201 | | LI R1,>08 | |
|      | 056C 0008 | | | |
| 0560 | 056E 0202 | | LI R2,>0800 | |
|      | 0570 0800 | | | |
| 0561 | 0572 06A0 | | BL @OPUT | |
|      | 0574 0156' | | | |
| 0562 | 0576 22A0 | OT6 | COC @MSK7,R10 | TEST PULSE OUTPUT? |
|      | 0578 08F2 | | | |
| 0563 | 057A 160B | | JNE OT7 | |
| 0564 | 057C E2A0 | | SOC @MSK0,R10 | SET TEST FLAG |
|      | 057E 08E4 | | | |
| 0565 | 0580 1DF7 | | SBO -9 | TURN ON TEST LIGHT |
| 0566 | 0582 0203 | | LI R3,>14D | LOAD 1 SECOND TIMER |
|      | 0584 014D | | | |
| 0567 | 0586 0201 | | LI R1,>80 | |
|      | 0588 0080 | | | |
| 0568 | 058A 0202 | | LI R2,>8000 | |
|      | 058C 8000 | | | |

| RECD | LOC | OBJ | | SOURCE STATEMENT | |
|---|---|---|---|---|---|
| 0569 | 058E | 06A0 | | BL @OPUT | |
| | 0590 | 0156' | | | |
| 0570 | 0592 | 22A0 | OT7 | COC @MSK0,R10 | CHECK TEST FLAG |
| | 0594 | 08E4 | | | |
| 0571 | 0596 | 1602 | | JNE OT8 | JUMP IF NOT EQUAL |
| 0572 | 0598 | 0603 | | DEC R3 | DEC 1 SECOND TIMER |
| 0573 | 059A | 1302 | | JEQ OT9 | JUMP IF TIMEOUT |
| 0574 | 059C | 0460 | OT8 | B @START | |
| | 059E | 02A4' | | | |
| 0575 | 05A0 | 1EF7 | OT9 | SBZ -9 | TURN OFF TEST LIGHT |
| 0576 | 05A2 | 42A0 | | SZC @MSK0,R10 | RESET TEST FLAG |
| | 05A4 | 08E4 | | | |
| 0577 | 05A6 | 10FA | | JMP OT8 | |
| 0578 | | | | END | |

We claim:

1. A digital processing and calculating AC electric energy metering system for measuring a parameter of an electric energy quantity occurring in an electric utility system, said metering system comprising:

signal sample means including inputs and outputs, said inputs receiving intput voltage and current signal components of said AC electric energy quantity, said outputs producing instantaneous values of the input voltage and current signals when said signal sample means is rendered to a sampling state;

sampler timer means producing pulse signals at randomly varying intervals, said pulse signals initiating the sampling state of said signal sample means at randomly occurring sampling times;

analog to digital converter means producing binary signal representations of each of the instantaneous signal values;

calculating means computing an incremental quantity of the input signals from said binary signal representations thereof occurring at each sampling time;

accumulator means receiving each incremental quantity computed so as to store totalized values thereof, said totalized values being a time integral of the sums of each computed incremental quantity received to produce measured values of said parameter; and output means responsive to the stored totalized values of said accumulator means to produce data output signals representing the measured parameter values.

2. The metering system as claimed in claim 1 wherein said input voltage and current signals are polyphase components of a polyphase electric energy quantity and wherein said data output signals represent the predetermined parameter of said polyphase electric energy quantity.

3. The metering system as claimed in claim 1 including a readout display device responsive to the measured value of the parameter and producing a corresponding numerical reading of the totalized values.

4. The metering system as claimed in claim 1 wherein said data output signals are pulse signals each representing a predetermined amount of the parameter to be measured.

5. The metering system as claimed in claim 4 including second accumulator means storing totalized values of the sums of each computed incremental quantity to store real-time totalized values of the parameter to be measured, and wherein said metering system includes means limiting the stored totalized values in said first named accumulator means and wherein each of the pulse data output signals is produced when the limit of the totalized values is reached.

6. The system as claimed in claim 1 wherein said calculating means computes a plurality of incremental quantities related to a corresponding plurality of parameters of the electric energy quantity and wherein said accumulator means separately receives each of the incremental quantities computed so as to separately store the totalized values thereof, each of the separate totalized values being a time integral of the sums of each of said plurality of computed incremental quantities received to produce measured values for each of said plurality of parameters of said electric energy quantity, and wherein said output means is responsive to the separately stored totalized values of said accumulator means to produce plural data output signals representing said measured values of each of said plurality of parameters.

7. The metering system of claim 6 including a second accumulator means for storing separate totalized values of each of the plurality of computed incremental quantities, and including second output means responsive to each of the stored totalized values in said second accumulator means.

8. The metering system as claimed in claim 7 wherein said second output means includes a numerical readout display means and said metering system includes a display selector means for selectively displaying a readout corresponding to a separate one of said totalized values to thereby selectively display one of said plurality of parameters.

9. A metering system as claimed in claim 7 wherein said separate totalized values stored in said first named and said second accumulator means are measured values of said plurality of parameters including kilowatt-hours, Q-hours and volts-squared-hours.

10. The metering system as claimed in claim 9 including means for receiving demand interval pulse signals and wherein said second accumulator means includes stored measured values of a further parameter including peak kilowatt demand, said second accumulator including first storing means for storing each of the totalized values of kilowatt-hours occurring between consecutive demand interval pulses, and further including second storing means for storing the highest totalized values of kilowatt-hours stored in said first storing means.

11. The metering system as claimed in claim 10 including a manual demand reset control means for resetting the first and second storing means to zero.

12. The metering system as claimed in claim 6 wherein said plural data output signals are pulses having opposite binary states.

13. The system as claimed in claim 12 including a magnetic recorder having plural recording heads conducting current in opposite direction in response to the opposite binary states of the plural pulse data output signals to provide NRZ recordings of said plural data output signals.

14. The metering system as claimed in claim 13 wherein said magnetic tape recorder includes a source of demand interval pulse signals being applied to said means for receiving said demand interval pulses and further wherein said recorder includes a further recording head for recording said demand interval pulse signal concurrently with the recording of the plural pulse data output signals.

15. The metering system as claimed in claim 1 including a sequence controller and calculator subsystem having a programmed sequence of operation.

16. The metering system as claimed in claim 15 wherein said sequence controller and calculator subsystem includes a source of clock signals for synchronizing operation of the sequence controller and calculator subsystem, and wherein said clock source produces clock signals to said sample timer means, and said sample timer means including a counter circuit arrangement for producing said pulse signals at a rate related to a predetermined ratio of the rate of said clock signals.

17. The metering system as claimed in claim 16 wherein said sample timer means includes said counter circuit arrangement having different preselectable outputs for selecting different fixed predetermined output rates for said pulse signals.

18. The metering system as claimed in claim 17 wherein pulse signals produced from said sample timer means are applied to said sequence controller and calculator subsystem with the subsystem having a random delay means for producing a sampling control signal to said signal sample means at randomly varying time delays following each of said pulse signals and for producing a resetting signal to said sample timer means.

19. The metering system as claimed in claim 18 wherein said random delay means includes a source of a predetermined sequence of randomly occurring numbers having a means value and wherein said random delay means further includes a predetermined number of different time delay periods each corresponding to a different number in said sequence of randomly occurring numbers, a separate one of said randomly occurring numbers being detected prior to the occurrence of said sampling control signal whereupon a corresponding time delay period occurs before said sampling control signal is initiated.

20. The metering system as claimed in claim 19 wherein said pulse signals from said signal sample means initiate the beginning of said time delay periods, and wherein said different time delay periods include equal quantized delay values, and the mean of the randomized delay periods produces a predetermined average sampling interval time period.

21. The metering system as claimed in claim 1 including a power supply having an output for supplying solid state circuits included in said metering system, said power supply receiving primary power from an AC electric utility source, said output of said power supply means including a temporary storage means for supplying power to said system for a temporary time period following an outage of said primary power input.

22. The metering system as claimed in claim 21 including a sequence controller and calculator subsystem having a random access memory for storing data while being energized from said power supply means.

23. The metering system as claimed in claim 22 wherein said power supply means includes a battery chargeable from said primary power and effective to maintain said random access memories energized following an outage of said primary power.

24. The metering system as claimed in claim 23 wherein said supply includes a monitoring circuit for producing a power fail signal when an outage of primary power occurs.

25. The metering system as claimed in claim 24 wherein said sequence controller and calculator subsystem receives said power fail signal and initiates a system stop signal to said power supply means, and wherein said power supply means includes a gating circuit responsive to both said power fail signal and said stop signal to initiate a SYSINT signal effective to reset said sequence controller and calculator subsystem.

26. The metering system as claimed in claim 25 wherein said sample timer includes means for producing a second SYSINT signal in response to a first time period being longer than a second time period with said second time period being approximately equal to the average time period for pulse signals produced from said sample timer means and with said first time period occurring only if said pulse signal is not produced, to reset said sequence controller and calculator subsystem.

27. The metering system as claimed in claim 1 including a sequence controller and calculator subsystem having a programmed sequence of operation being stored in a read only memory included in said sequence controller and calculator subsystem.

28. The metering system as claimed in claim 27 wherein said sequence controller and calculator subsystem includes a microprocessor type central processing unit connected to said read only memory and wherein said sequence controller and calculator subsystem includes a random access memory connected to said read only memory and to said central processing unit.

29. The metering system as claimed in claim 28 wherein said read only memory includes permanently stored system constants including limit values for stored values in said accumulator means.

30. The metering system as claimed in claim 29 wherein said system constants are stored in said random access memories and whereupon said sequence of operation of said sequence controller and calculator subsystem includes comparison of the system constants stored in the random access memory with the system constants stored in said read only memory, said sequence controller and calculator subsystem further including means for preventing further operation of said sequence controller and calculator subsystem if said system constants stored in said random memory access are not the same as the system constants stored in said read only memory.

* * * * *